US012783248B2

(12) United States Patent
Ware et al.

(10) Patent No.: US 12,783,248 B2
(45) Date of Patent: Nov. 3, 2026

(54) MULTIPLY-ACCUMULATE WITH VARIABLE FLOATING POINT PRECISION

(71) Applicant: Analog Devices, Inc., Wilmington, MA (US)

(72) Inventors: Frederick A. Ware, Los Altos Hills, CA (US); Cheng C. Wang, Los Altos, CA (US); Fang-Li Yuan, San Jose, CA (US); Nitish U. Natu, Santa Clara, CA (US)

(73) Assignee: Analog Devices, Inc., Wilmington, MA (US)

( * ) Notice: Subject to any disclaimer, the term of this patent is extended or adjusted under 35 U.S.C. 154(b) by 985 days.

(21) Appl. No.: 18/088,153

(22) Filed: Dec. 23, 2022

(65) Prior Publication Data

US 2023/0131459 A1 Apr. 27, 2023

Related U.S. Application Data

(62) Division of application No. 16/900,319, filed on Jun. 12, 2020, now abandoned.

(Continued)

(51) Int. Cl.
*G06F 9/38* (2018.01)
*G06F 7/501* (2006.01)

(Continued)

(52) U.S. Cl.
CPC ............ *G06F 9/3893* (2013.01); *G06F 7/501* (2013.01); *G06F 7/5443* (2013.01);

(Continued)

(58) Field of Classification Search
CPC ...... G06F 9/3893; G06F 30/323; G06F 7/501; G06F 7/5443; G06F 9/30014;

(Continued)

(56) References Cited

U.S. PATENT DOCUMENTS 4,958,312 A 9/1990 Ang et al.
6,115,729 A 9/2000 Matheny et al.

(Continued)

FOREIGN PATENT DOCUMENTS

EP 0405726 B1 3/1999
EP 2280341 B1 6/2013
WO 2018126073 A1 7/2018

OTHER PUBLICATIONS

"NVidia A100 Tensor Core GPU Architecture", v1.0, 2020, 82 pages.

(Continued)

*Primary Examiner* — Suchin Parihar
(74) *Attorney, Agent, or Firm* — DLA Piper LLP (US)

(57) ABSTRACT

An integrated circuit including a multiplier-accumulator execution pipeline including a plurality of multiplier-accumulator circuits to, in operation, perform multiply and accumulate operations, wherein each multiplier-accumulator circuit includes: (i) a multiplier to multiply first input data, having a first floating point data format, by a filter weight data, having the first floating point data format, and generate and output a product data having a second floating point data format, and (ii) an accumulator, coupled to the multiplier of the associated MAC circuit, to add second input data and the product data output by the associated multiplier to generate sum data. The plurality of multiplier-accumulator circuits of the multiplier-accumulator execution pipeline may be connected in series and, in operation, perform a plurality of concatenated multiply and accumulate operations.

20 Claims, 32 Drawing Sheets

Related U.S. Application Data

(60) Provisional application No. 62/865,113, filed on Jun. 21, 2019.

(51) Int. Cl.
*G06F 7/544* (2006.01)
*G06F 9/30* (2018.01)
*G06F 15/173* (2006.01)
*G06F 30/323* (2020.01)

(52) U.S. Cl.
CPC ...... *G06F 9/30014* (2013.01); *G06F 9/30079* (2013.01); *G06F 15/17375* (2013.01); *G06F 30/323* (2020.01); *G06F 2207/3884* (2013.01)

(58) Field of Classification Search
CPC ........... G06F 9/30079; G06F 15/17375; G06F 2207/3884
USPC .......................................................... 716/104
See application file for complete search history.

(56) References Cited

U.S. PATENT DOCUMENTS

| | | | | |
|---|---|---|---|---|
| 6,148,101 | A | 11/2000 | Tanaka et al. | |
| 6,298,366 | B1 | 10/2001 | Gatherer et al. | |
| 7,107,305 | B2 | 9/2006 | Deng et al. | |
| 7,299,342 | B2 | 11/2007 | Nilsson et al. | |
| 7,346,644 | B1 | 3/2008 | Langhammer et al. | |
| 7,698,358 | B1 | 4/2010 | Langhammer et al. | |
| 8,051,124 | B2 | 11/2011 | Salama et al. | |
| 8,185,850 | B1 * | 5/2012 | Schumacher | G06F 30/30 716/132 |
| 8,266,199 | B2 | 9/2012 | Langhammer et al. | |
| 8,645,450 | B1 | 2/2014 | Choe et al. | |
| 8,751,551 | B2 | 6/2014 | Streicher et al. | |
| 8,788,562 | B2 | 7/2014 | Langhammer et al. | |
| 8,914,430 | B2 * | 12/2014 | Gradstein | G06F 7/483 708/501 |
| 9,104,474 | B2 * | 8/2015 | Kaul | G06F 7/5443 |
| 9,104,510 | B1 * | 8/2015 | Rub | G06F 7/5443 |
| 9,600,278 | B1 | 3/2017 | Langhammer | |
| 9,904,514 | B1 * | 2/2018 | Czajkowski | G06F 7/485 |
| 11,314,504 | B2 | 4/2022 | Ware et al. | |
| 2002/0178285 | A1 * | 11/2002 | Donaldson | G06F 30/30 709/237 |
| 2003/0172101 | A1 | 9/2003 | Liao et al. | |
| 2007/0239967 | A1 | 10/2007 | Dally et al. | |
| 2008/0211827 | A1 | 9/2008 | Donovan et al. | |
| 2009/0094303 | A1 | 4/2009 | Katayama | |
| 2013/0144589 | A1 * | 6/2013 | Levi | G06F 30/00 703/14 |
| 2014/0019727 | A1 | 1/2014 | Zhu et al. | |
| 2017/0011288 | A1 | 1/2017 | Brothers et al. | |
| 2017/0115958 | A1 | 4/2017 | Langhammer | |
| 2017/0116693 | A1 | 4/2017 | Rae et al. | |
| 2017/0214929 | A1 | 7/2017 | Susnow et al. | |
| 2017/0315778 | A1 | 11/2017 | Sano | |
| 2017/0322769 | A1 * | 11/2017 | Langhammer | G06F 5/012 |
| 2017/0322813 | A1 | 11/2017 | Langhammer | |
| 2017/0344876 | A1 | 11/2017 | Brothers | |
| 2018/0052661 | A1 | 2/2018 | Langhammer | |
| 2018/0081632 | A1 | 3/2018 | Langhammer | |
| 2018/0081633 | A1 | 3/2018 | Langhammer | |
| 2018/0157961 | A1 | 6/2018 | Henry et al. | |
| 2018/0189651 | A1 | 7/2018 | Henry et al. | |
| 2018/0300105 | A1 | 10/2018 | Langhammer | |
| 2018/0314492 | A1 | 11/2018 | Fais et al. | |
| 2018/0321909 | A1 | 11/2018 | Langhammer | |
| 2018/0321910 | A1 | 11/2018 | Langhammer et al. | |
| 2018/0341460 | A1 | 11/2018 | Langhammer | |
| 2018/0341461 | A1 | 11/2018 | Langhammer | |
| 2019/0005161 | A1 * | 1/2019 | Fleming | G06F 12/0862 |
| 2019/0042191 | A1 | 2/2019 | Langhammer | |
| 2019/0042244 | A1 | 2/2019 | Henry et al. | |
| 2019/0042544 | A1 | 2/2019 | Kashyap et al. | |
| 2019/0079728 | A1 | 3/2019 | Langhammer et al. | |
| 2019/0102175 | A1 * | 4/2019 | Roberts | G06F 9/30112 |
| 2019/0156242 | A1 * | 5/2019 | Haener | H04L 9/0852 |
| 2019/0196786 | A1 | 6/2019 | Langhammer | |
| 2019/0243610 | A1 | 8/2019 | Lin et al. | |
| 2019/0250886 | A1 | 8/2019 | Langhammer | |
| 2019/0286417 | A1 | 9/2019 | Langhammer | |
| 2019/0310828 | A1 | 10/2019 | Langhammer et al. | |
| 2019/0324722 | A1 | 10/2019 | Langhammer | |
| 2019/0340489 | A1 | 11/2019 | Mills | |
| 2019/0392297 | A1 | 12/2019 | Lau et al. | |
| 2020/0004506 | A1 | 1/2020 | Langhammer et al. | |
| 2020/0026493 | A1 | 1/2020 | Streicher et al. | |
| 2020/0097799 | A1 | 3/2020 | Divakar et al. | |
| 2020/0174750 | A1 | 6/2020 | Langhammer | |
| 2020/0326948 | A1 | 10/2020 | Langhammer | |
| 2021/0042086 | A1 * | 2/2021 | Elliott | G06F 7/50 |
| 2022/0180171 | A1 * | 6/2022 | Sun | G06N 3/08 |

OTHER PUBLICATIONS

Agrawal et al., "A 7nm 4-Core AI Chip with 25.6TFLOPS Hybrid FP8 Training, 102.4TOPS INT4 Inference and Workload-Aware Throttling", ISSCC, pp. 144-145, 2021.
Choi et al., "Accurate and Efficient 2-Bit Quantized Neural Networks", Proceedings of 2nd SysML Conf, 2019, 12 pages.
Jebashini et al., "A Survey and Comparative Analysis of Multiply-Accumulate (MAC) Block for Digital Signal Processing Application on ASIC and FPGA", Journal of Applied Science, vol. 15, Issue 7, pp. 934-946, Jul. 2015.
Liang Yun, et al., "Evaluating Fast Algorithms for Convolutional Neural Networks on FPGAs", IEEE Transactions on Computer-Aided Design of Integrated Circuits and Systems, vol. 39, No. 4, Feb. 5, 2019, 14 pages(Note: The date identified on the article attached is Mar./Apr. 2020).
Linley Gwennap, "IBM Demonstrates New AI Data Types", Microprocessor Report, Apr. 2021.
Papadantonakis et al., "Pipelining Saturated Accumulation", IEEE, vol. 58, No. 2, pp. 208-219, Feb. 2009.
Priyanka Nain, "Multiplier-Accumulator (MAC) Unit", IJDACR, vol. 5, Issue 3, Oct. 2016, 4 pages.
Sun et al., "Hybrid 8-bit Floating Point (HFP8) Training and Inference for Deep Neural Networks", NeurIPS 2019, 10 pages.

* cited by examiner

Parameters to adjust precision of FPADD embodiment (part A)

```
//
// Set parameters for internal mantissa bus widths
// Full external mantissa range:
// {14,15,16,17,18,19,20,21,22,23,24,25,26,27,28,29,30,31}
// Bypass RS16/LS16 stages to handle {6,7,8,9,10,11,12,13}
// External mantissa:  16 20 24 28
parameter w27 = 27; // 19 23 27 31
parameter w26 = 26; // 18 22 26 30
parameter w25 = 25; // 17 21 25 29
parameter w24 = 24; // 16 20 24 28 // external width 24b
parameter w23 = 23; // 15 19 23 27
parameter w22 = 22; // 14 18 22 26
parameter w21 = 21; // 13 17 21 25
parameter w20 = 20; // 12 16 22 26
parameter w19 = 19; // 11 15 19 23
parameter w18 = 18; // 10 14 18 22
parameter w17 = 17; // 09 13 17 21
parameter w16 = 16; // 08 12 16 20
parameter w15 = 15; // 07 11 15 19
parameter w14 = 14; // 06 10 14 18
parameter w13 = 13; // 05 09 13 17
parameter w12 = 12; // 04 08 12 16
parameter w11 = 11; // 03 07 11 15
parameter w10 = 10; // 02 06 10 14
parameter p7  = 07; // 05 06 07 08
parameter p6  = 06; // 04 05 06 07 // p6=06 for 24b ext mantissa
```

FIG. 4A

Parameter adjustment range summary

| Parameter | | | | | | | | | | | | | | | | | | | | | | | | | | |
|---|---|---|---|---|---|---|---|---|---|---|---|---|---|---|---|---|---|---|---|---|---|---|---|---|---|---|
| w 27 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 |
| w 26 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 |
| w 25 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
| w 24 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| w 23 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
| w 22 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
| w 21 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 |
| w 20 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
| w 19 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 |
| w 18 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
| w 17 | -1 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| w 16 | -2 | -1 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
| w 15 | -3 | -2 | -1 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| w 14 | -4 | -3 | -2 | -1 | 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| w 13 | -5 | -4 | -3 | -2 | -1 | 0 | 1 | 2 | 3 | 4 | 5 | 6 | 7 | 8 | 9 | 10 | 11 | 12 | 13 | 14 | 15 | 16 | 17 | 18 | 19 | 20 |
| w 12 | -6 | -5 | -4 | -3 | -2 | -1 | 0 | 1 | 2 | 3 | 4 | 5 | 6 | 7 | 8 | 9 | 10 | 11 | 12 | 13 | 14 | 15 | 16 | 17 | 18 | 19 |
| w 11 | -7 | -6 | -5 | -4 | -3 | -2 | -1 | 0 | 1 | 2 | 3 | 4 | 5 | 6 | 7 | 8 | 9 | 10 | 11 | 12 | 13 | 14 | 15 | 16 | 17 | 18 |
| w 10 | -8 | -7 | -6 | -5 | -4 | -3 | -2 | -1 | 0 | 1 | 2 | 3 | 4 | 5 | 6 | 7 | 8 | 9 | 10 | 11 | 12 | 13 | 14 | 15 | 16 | 17 |
| bypass? | Y | Y | Y | Y | Y | Y | Y | Y | N | N | N | N | N | N | N | N | N | N | N | N | N | N | N | N | N | N |
| p 7 | 3 | 3 | 3 | 3 | 4 | 4 | 4 | 4 | 5 | 5 | 5 | 5 | 6 | 6 | 6 | 6 | 7 | 7 | 7 | 7 | 8 | 8 | 8 | 8 | 9 | 9 |
| p 6 | 2 | 2 | 2 | 2 | 3 | 3 | 3 | 3 | 4 | 4 | 4 | 4 | 5 | 5 | 5 | 5 | 6 | 6 | 6 | 6 | 7 | 7 | 7 | 7 | 8 | 8 |
| FPnn format | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 |
| sign | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| exponent | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 |
| mantissa | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
| mantissa | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
| (hidden) | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| mantissa (effective) | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| | | | FP16 | | | | FP20 | | | | FP24 | | | | FP28 | | | | FP32 | | | | FP36 | | | |

FIG. 4B

Example 1 of parameter usage to adjust FPADD precision

```
//
// add mantissa buses MWa and MRSg with carry-out
wire        COUTS0;
assign      {COUTS0, MSp} = MWa[0:w26] + MRSg[0:w26];
wire [0:w26] MS  = MSp[0:w26] ^ {w27{invMSp}};
wire [0:w22] MSq = MSp[0:w22] ^ {w23{invMSq}};
```

FIG. 5A

Example 2 of parameter usage to adjust FPADD precision

```
//
// [F] Select the correct RS normalize/round case
// Logic Block 6 (RND-R)
//
// RS0 case
wire        INC_R0t  =
              ((RND_NEAR & MS[w24] & (|{MS[w23], MS[w25:w26]})) |
               (RND_PINF & ~SW     & (|{MS[w24:w26]})) |
               (RND_NINF &  SW     & (|{MS[w24:w26]})));
wire        INC_R0   = (MS[w23] & INC_R0t);
wire [w23:w23] MR0a;
wire [w23:w23] MR0b;
assign      MR0a[w23] = MS[w23] ^ INC_R0t;
assign      MR0b[w23] = MS[w23] ^ INC_R0t;
```

FIG. 5B

FPADD-32 area summary

| | | Number of elements in each section | | | | | | | Area per element (u^2) | | | | | | | | |
|---|---|---|---|---|---|---|---|---|---|---|---|---|---|---|---|---|---|
| | | Register | Gates# | Muxes | Wires* | ADDs | PENs | | Register | Gates | Muxes | Wires* | ADDs | PENs | | | |
| | | | | | | | | | 0.3 | 0.2 | 0.3 | 1.3 | 0.6 | 0.6 | | u^2 | |
| Control | | | 270 | | | | | | 0.0 | 54.0 | 0.0 | 0.0 | 0.0 | 0.0 | | 54.0 | 10.8% |
| Exponent | Register | 16 | | | | | | | 4.8 | 0.0 | 0.0 | 0.0 | 0.0 | 0.0 | | 4.8 | 1.0% |
| | Compare | | | | | 16 | | | 0.0 | 0.0 | 0.0 | 0.0 | 9.6 | 0.0 | | 9.6 | 1.9% |
| | Swap | | | 16 | | | | | 0.0 | 0.0 | 4.6 | 0.0 | 0.0 | 0.0 | | 4.6 | 0.9% |
| | Normalize | | | 8 | | 16 | | | 0.0 | 0.0 | 2.3 | 0.0 | 9.6 | 0.0 | | 11.9 | 2.4% |
| | Constant | | | 32 | | | | | 0.0 | 0.0 | 9.3 | 0.0 | 0.0 | 0.0 | | 9.3 | 1.9% |
| | | Exponent path is 8b wide | | | | | | | | | | | | | | 40.2 | 8.0% |
| Mantissa | Register | 48 | | | | | | | 14.4 | 0.0 | 0.0 | 0.0 | 0.0 | 0.0 | | 14.4 | 2.9% |
| | Swap | | | 54 | | | | | 0.0 | 0.0 | 15.7 | 0.0 | 0.0 | 0.0 | | 15.7 | 3.1% |
| 0-31 RS | Align | | 31 | 135 | 27 | | | | 0.0 | 6.2 | 39.2 | 35.1 | 0.0 | 0.0 | | 80.5 | 16.1% |
| | Add/Sub | | | 189 | | 27 | | | 0.0 | 0.0 | 54.8 | 0.0 | 16.2 | 0.0 | | 71.0 | 14.2% |
| 0-31 LS | Normalize | | | 135 | 27 | | 54 | | 0.0 | 0.0 | 39.2 | 35.1 | 0.0 | 32.4 | | 106.7 | 21.3% |
| | Round | | | 189 | | 27 | | | 0.0 | 0.0 | 54.8 | 0.0 | 16.2 | 0.0 | | 71.0 | 14.2% |
| | Constant | | | 162 | | | | | 0.0 | 0.0 | 47.0 | 0.0 | 0.0 | 0.0 | | 47.0 | 9.4% |
| | | Mantissa path is 27b wide | | | | | | | | | | | | | | 406.2 | 81.2% |
| | | | | | | | | | | | | | | | | 500.4 | 100.0% |
| | # two-input gate equivalents | | | | | | | u^2 | 19.2 | 60.2 | 266.8 | 70.2 | 51.6 | 32.4 | 500.4 | 497 | |
| | * 31 horizontal wire tracks | | | | | | | | 3.8% | 12.0% | 53.3% | 14.0% | 10.3% | 6.5% | 100.0% | | u^2 |

FIG. 6A

FPADD-24 area summary

| | | Number of elements in each section | | | | | | | Area per element (u^2) | | | | | | | | |
|---|---|---|---|---|---|---|---|---|---|---|---|---|---|---|---|---|---|
| | | Register | Gates# | Muxes | Wires* | ADDs | PENs | | Register | Gates | Muxes | Wires* | ADDs | PENs | | | |
| | | | | | | | | | 0.3 | 0.2 | 0.3 | 0.7 | 0.6 | 0.6 | | | |
| | | | | | | | | | | | | | | | | u^2 | |
| Control | | | 270 | | | | | | 0.0 | 54.0 | 0.0 | 0.0 | 0.0 | 0.0 | | 54.0 | 10.8% |
| Exponent | Register | 16 | | | | | | | 4.8 | 0.0 | 0.0 | 0.0 | 0.0 | 0.0 | | 4.8 | 1.3% |
| | Compare | | | | | 16 | | | 0.0 | 0.0 | 0.0 | 0.0 | 9.6 | 0.0 | | 9.6 | 2.7% |
| | Swap | | | 16 | | | | | 0.0 | 0.0 | 4.6 | 0.0 | 0.0 | 0.0 | | 4.6 | 1.3% |
| | Normalize | | | 8 | | 16 | | | 0.0 | 0.0 | 2.3 | 0.0 | 9.6 | 0.0 | | 11.9 | 3.3% |
| | Constant | | | 32 | | | | | 0.0 | 0.0 | 9.3 | 0.0 | 0.0 | 0.0 | | 9.3 | 2.6% |
| | | Exponent path is 8b wide | | | | | | | | | | | | | | 40.2 | 11.1% |
| Mantissa | Register | 48 | | | | | | | 14.4 | 0.0 | 0.0 | 0.0 | 0.0 | 0.0 | | 14.4 | 4.0% |
| | Swap | | | 38 | | | | | 0.0 | 0.0 | 11.0 | 0.0 | 0.0 | 0.0 | | 11.0 | 3.1% |
| 0-17 RS | Align | | 17 | 95 | 19 | | | | 0.0 | 3.4 | 27.6 | 13.5 | 0.0 | 0.0 | | 44.5 | 12.3% |
| | Add/Sub | | | 133 | | 19 | | | 0.0 | 0.0 | 38.6 | 0.0 | 11.4 | 0.0 | | 50.0 | 13.8% |
| 0-17 LS | Normalize | | | 95 | 19 | | 38 | | 0.0 | 0.0 | 27.6 | 13.5 | 0.0 | 22.8 | | 63.9 | 17.7% |
| | Round | | | 133 | | 19 | | | 0.0 | 0.0 | 38.6 | 0.0 | 11.4 | 0.0 | | 50.0 | 13.8% |
| | Constant | | | 114 | | | | | 0.0 | 0.0 | 33.1 | 0.0 | 0.0 | 0.0 | | 33.1 | 9.2% |
| | | Mantissa path is 19b wide | | | | | | | | | | | | | | 266.8 | 73.9% |
| | | | | | | | | | | | | | | | | 361.1 | 100.0% |
| | # two-input gate equivalents | | | | | | | u^2 | 19.2 | 57.4 | 192.6 | 27.1 | 42.0 | 22.8 | 361.1 | 361 | |
| | * 17 horizontal wire tracks | | | | | | | | 5.3% | 15.9% | 53.3% | 7.5% | 11.6% | 6.3% | 100.0% | | u^2 |

FIG. 6B

Left-shift module/circuit for exemplary FPADD32 embodiment

```
////////////////////////////////////////////////////////////////////
// LS32 module (continuous assignment)
//
module FPADD32_LS32 (D, LS, Q);
//
// input and output ports
input  [0:w26]  D;
input  [4: 0]   LS;
output [0:w26]  Q;
//
wire [0:w26]        LS4_mux;
wire [0:w26]        LS3_mux;
wire [0:w26]        LS2_mux;
wire [0:w26]        LS1_mux;
wire [0:w26]        LS0_mux;
////////////////////////////////////////////////////////////////////
//
// FPADD32 - LS0-LS31 shifting option
//
assign LS4_mux[ 0:w26] = LS[4] ? {     D[16:w26],16'h0000} :    D[ 0:w26];
assign LS3_mux[ 0:w26] = LS[3] ? {LS4_mux[8:w26],8'h00} : LS4_mux[ 0:w26];
assign LS2_mux[ 0:w26] = LS[2] ? {LS3_mux[4:w26],4'h0}  : LS3_mux[ 0:w26];
assign LS1_mux[ 0:w26] = LS[1] ? {LS2_mux[2:w26],2'h0}  : LS2_mux[ 0:w26];
assign LS0_mux[ 0:w26] = LS[0] ? {LS1_mux[1:w26],1'h0}  : LS1_mux[ 0:w26];
assign        Q[0:w26] = LS0_mux[0:w26] ;
//
```

FIG. 8A

Left-shift module/circuit for exemplary FPADD24 embodiment

```
/////////////////////////////////////////////////////////////////
// LS32 module (continuous assignment)
//
module FPADD24_LS18 (D, LS, Q);
//
// input and output ports
input  [0:w26]  D;
input  [4: 0]   LS;
output [0:w26]  Q;
//
wire [0:w26]        LS4_mux;
wire [0:w26]        LS3_mux;
wire [0:w26]        LS2_mux;
wire [0:w26]        LS1_mux;
wire [0:w26]        LS0_mux;
//
/////////////////////////////////////////////////////////////////
//
// FPADD24 - LS0-LS17 shifting option
//
assign LS3_mux[ 0:w26] = LS[3] ? {       D[8:w26],8'h00} :        D[ 0:w26];
assign LS2_mux[ 0:w26] = LS[2] ? {LS3_mux[4:w26],4'h0}  : LS3_mux[ 0:w26];
assign LS1_mux[ 0:w26] = LS[1] ? {LS2_mux[2:w26],2'h0}  : LS2_mux[ 0:w26];
assign LS0_mux[ 0:w26] = LS[0] ? {LS1_mux[1:w26],1'h0}  : LS1_mux[ 0:w26];
assign LS4_mux[ 0:w26] = LS[4] ? {LS0_mux[2:w26],2'h0}  : LS0_mux[ 0:w26];
assign        Q[0:w26] = LS4_mux[0:w26] ;
```

FIG. 8B

Circuitry for and generation of left-shift control signals for exemplary FPADD32 and FPADD24 embodiments

```
//
// PEN logic
wire [4:0]      PEN = COUTS0 ? PEN_C1[4:0] : PEN_C0[4:0];
wire [ 0:w23]  ML2;
wire [w24:w26] ML2_NC;
//
///////////////////////////////////////////////////////////
// PEN logic for FPADD24
//wire [4:0]    PENb = COUTS0 ? {1'b0,PEN_C1[3:0]} |
//                             {{4{PEN_C1[4]}}, 1'b0} :
//                              {1'b0,PEN_C0[3:0]} |
//                             {{4{PEN_C0[4]}}, 1'b0} ;
// PEN logic for FPADD32
wire [4:0]      PENb = PEN[4:0];
///////////////////////////////////////////////////////////
```

FIG. 8C

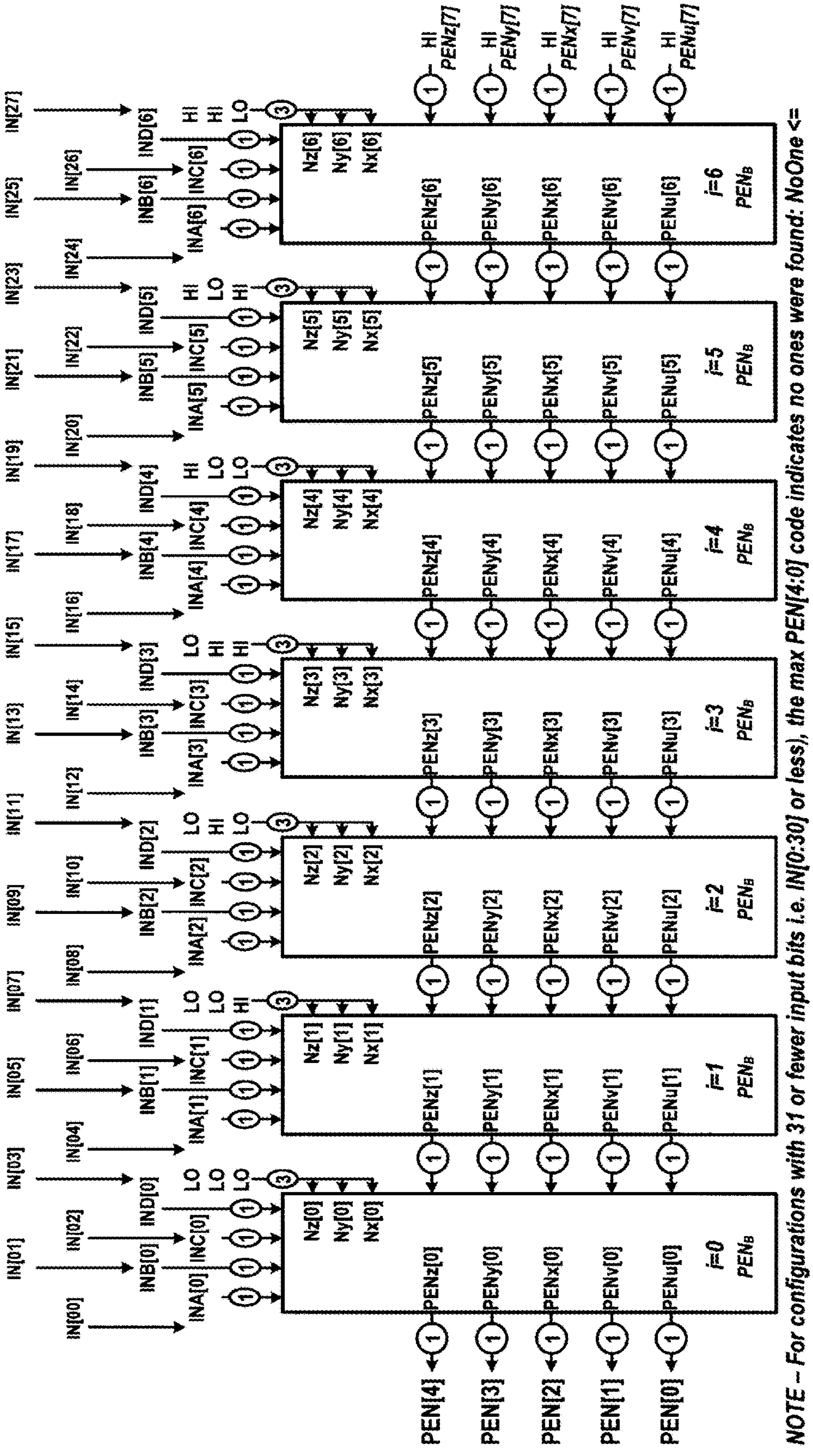

*NOTE – For configurations with 31 or fewer input bits i.e. IN[0:30] or less), the max PEN[4:0] code indicates no ones were found: NoOne <= (PEN[4:0]=31).*

*-- For the configuration with 32 input bits i.e. IN[0:31] ) the max PEN[4:0] code indicates either [a] no ones were found, or [b] IN[31] was the only input bit that was a one. This case of no ones is detected by adding one gate to the control logic: NoOne <= AND ( NOT(IN[31]), (PEN[4:0]=31) )*

*NOTE – if the number of IN[i] bits is not a multiple of "4", then unused inputs are positioned on the right and must contain "LO"*

FIG. 10B

Priority encode module/circuit B for FPADD32 or FPADD24 embodiments

```
//
// PEN32 module (continuous assignment)     NEW module
module FPADD24_PEN32 (IN, PEN);
//
input [0:w26]   IN;
output [4:0]    PEN;   // fixed - flipped order
//
wire [0:7]  INA, INB, INC, IND;
wire [0:31] INz = 32'h00000000;
wire [0:31] INt = {IN[0:w26],INz[w27:31]};
wire [0:7]  Nz = 8'b00001111;
wire [0:7]  Ny = 8'b00110011;
wire [0:7]  Nx = 8'b01010101;
//
assign INA[0:7] = {INt[00], INt[04], INt[08], INt[12],
                   INt[16], INt[20], INt[24], INt[28]};
assign INB[0:7] = {INt[01], INt[05], INt[09], INt[13],
                   INt[17], INt[21], INt[25], INt[29]};
assign INC[0:7] = {INt[02], INt[06], INt[10], INt[14],
                   INt[18], INt[22], INt[26], INt[30]};
assign IND[0:7] = {INt[03], INt[07], INt[11], INt[15],
                   INt[19], INt[23], INt[27], INt[31]};
//
wire [0:p6] MCz,  MCy,  MCx,  MCv,  MCu ;
wire [0:p6] MBz,  MBy,  MBx,  MBv,  MBu ;
wire [0:p6] MAz,  MAy,  MAx,  MAv,  MAu ;
wire [0:p7] PENz, PENy, PENx, PENv, PENu ;
wire [0:p6] OR4;
```

FIG. 10C

Priority encode module/circuit B for FPADD32/FPADD24 embodiments

```
//
assign MCz[0:p6] = (~INC[0:p6] & Nz[0:p6])      | (INC[0:p6] & Nz[0:p6]);
assign MCy[0:p6] = (~INC[0:p6] & Ny[0:p6])      | (INC[0:p6] & Ny[0:p6]);
assign MCx[0:p6] = (~INC[0:p6] & Nx[0:p6])      | (INC[0:p6] & Nx[0:p6]);
assign MCv[0:p6] = (~INC[0:p6] & {p7{1'b1}} ) | (INC[0:p6] & {p7{1'b1}} );
assign MCu[0:p6] = (~INC[0:p6] & {p7{1'b1}} ) | (INC[0:p6] & {p7{1'b0}} );
//
assign MBz[0:p6] = (~INB[0:p6] & MCz[0:p6]) | (INB[0:p6] & Nz[0:p6]);
assign MBy[0:p6] = (~INB[0:p6] & MCy[0:p6]) | (INB[0:p6] & Ny[0:p6]);
assign MBx[0:p6] = (~INB[0:p6] & MCx[0:p6]) | (INB[0:p6] & Nx[0:p6]);
assign MBv[0:p6] = (~INB[0:p6] & MCv[0:p6]) | (INB[0:p6] & {p7{1'b0}} );
assign MBu[0:p6] = (~INB[0:p6] & MCu[0:p6]) | (INB[0:p6] & {p7{1'b1}} );
//
assign MAz[0:p6] = (~INA[0:p6] & MBz[0:p6]) | (INA[0:p6] & Nz[0:p6]);
assign MAy[0:p6] = (~INA[0:p6] & MBy[0:p6]) | (INA[0:p6] & Ny[0:p6]);
assign MAx[0:p6] = (~INA[0:p6] & MBx[0:p6]) | (INA[0:p6] & Nx[0:p6]);
assign MAv[0:p6] = (~INA[0:p6] & MBv[0:p6]) | (INA[0:p6] & {p7{1'b0}} );
assign MAu[0:p6] = (~INA[0:p6] & MBu[0:p6]) | (INA[0:p6] & {p7{1'b0}} );
//
assign OR4[0:p6] = INA[0:p6] | INB[0:p6] | INC[0:p6] | IND[0:p6];
//
assign PENz[p7] = 1'b1;
assign PENy[p7] = 1'b1;
assign PENx[p7] = 1'b1;
assign PENv[p7] = 1'b1;
assign PENu[p7] = 1'b1;
//
assign PENz[0:p6] = (~OR4[0:p6] & PENz[1:p7]) | (OR4[0:p6] & MAz[0:p6]);
assign PENy[0:p6] = (~OR4[0:p6] & PENy[1:p7]) | (OR4[0:p6] & MAy[0:p6]);
assign PENx[0:p6] = (~OR4[0:p6] & PENx[1:p7]) | (OR4[0:p6] & MAx[0:p6]);
assign PENv[0:p6] = (~OR4[0:p6] & PENv[1:p7]) | (OR4[0:p6] & MAv[0:p6]) ;
assign PENu[0:p6] = (~OR4[0:p6] & PENu[1:p7]) | (OR4[0:p6] & MAu[0:p6]) ;
//
assign PEN[4:0] =   {PENz[0],PENy[0],PENx[0],PENv[0],PENu[0] };
//
endmodule // FPADD24_PEN32
```

FIG. 10D

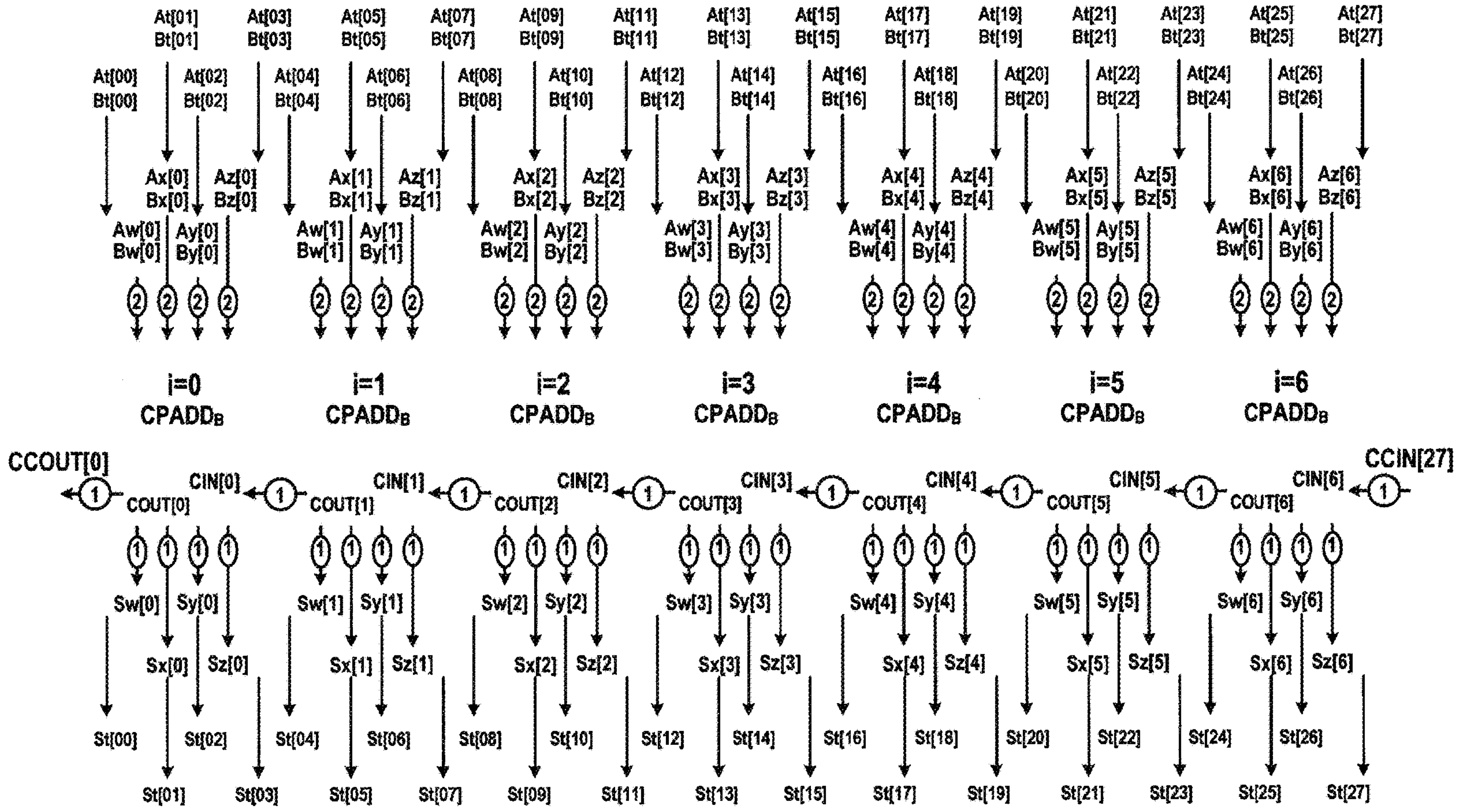

*NOTE – if the number of IN[i] bits is not a multiple of "4", then unused inputs are positioned on the right and must contain "LO"*

*NOTE – For configurations with 31 or fewer input bits i.e. IN[0:30] or less), the max PEN[4:0] code indicates no ones were found: NoOne <= (PEN[4:0]=31).*

*-- For the configuration with 32 input bits i.e. IN[0:31] ) the max PEN[4:0] code indicates either [a] no ones were found, or [b] IN[31] was the only input bit that was a one. This case of no ones is detected by adding one gate to the control logic: NoOne <= AND ( NOT(IN[31]), (PEN[4:0]=31) )*

FIG. 11B

Verilog code for adder module/circuit B for FPADD32/FPADD24 embodiments

```
//
input [0:w26]   A;
input [0:w26]   B;
input           CCIN;
output [0:w26]  S;
output          CCOUT;
//
wire [0:7]  Aw, Ax, Ay, Az;
wire [0:32] Ao = 33'h000000000;
wire [0:32] At = {A[0:w26],Ao[w27:32]};
wire [0:7]  Bw, Bx, By, Bz;
wire [0:32] Bo = 33'h000000000;
wire [0:32] Bt = {B[0:w26],Bo[w27:32]};
wire [0:7]  Sw, Sx, Sy, Sz;
wire [0:32] So = 33'h000000000;
wire [0:32] St = {B[0:w26],Bo[w27:32]};
//
assign Aw[0:7] = {At[00], At[04], At[08], At[12],
                  At[16], At[20], At[24], At[28]};
assign Ax[0:7] = {At[01], At[05], At[09], At[13],
                  At[17], At[21], At[25], At[29]};
assign Ay[0:7] = {At[02], At[06], At[10], At[14],
                  At[18], At[22], At[26], At[30]};
assign Az[0:7] = {At[03], At[07], At[11], At[15],
                  At[19], At[23], At[27], At[31]};
//
assign Bw[0:7] = {Bt[00], Bt[04], Bt[08], Bt[12],
                  Bt[16], Bt[20], Bt[24], Bt[28]};
assign Bx[0:7] = {Bt[01], Bt[05], Bt[09], Bt[13],
                  Bt[17], Bt[21], Bt[25], Bt[29]};
assign By[0:7] = {Bt[02], Bt[06], Bt[10], Bt[14],
                  Bt[18], Bt[22], Bt[26], Bt[30]};
assign Bz[0:7] = {Bt[03], Bt[07], Bt[11], Bt[15],
                  Bt[19], Bt[23], Bt[27], Bt[31]};
```

FIG. 11C

Verilog code for adder module/circuit B for FPADD32/FPADD24 embodiments

```
wire [0:p6] Gz,  Gy,  Gx,  Gw ;
wire [0:p6] Pz,  Py,  Px,  Pw ;
wire [0:p6] Rz,  Ry,  Rx,  Rw ;
wire [0:p6] PP;
wire [0:p6] CINz,  CINy,  CINx,  CINv,  CINu ;
wire [0:p6] COUTz, COUTy, COUTx, COUTv, COUTu;
//
assign CINz[0:p6] = {COUT[1:p5], CCIN};
//
assign Gz[0:p6]    = (Az[0:p6] & Bz[0:p6]);
assign Pz[0:p6]    = (Az[0:p6] | Bz[0:p6]);
assign Rz[0:p6]    = (Az[0:p6] ^ Bz[0:p6]);
assign Sz[0:p6]    = (Rz[0:p6] ^ CINz[0:p6]);
assign COUTz[0:p6] = (Pz[0:p6] & CINz[0:p6]) | (Gz[0:p6]);
//
assign Gy[0:p6]    = (Ay[0:p6] & By[0:p6]);
assign Py[0:p6]    = (Ay[0:p6] | By[0:p6]);
assign Ry[0:p6]    = (Ay[0:p6] ^ By[0:p6]);
assign Sy[0:p6]    = (Ry[0:p6] ^ CINy[0:p6]);
assign COUTy[0:p6] = (Py[0:p6] & CINy[0:p6]) | (Gy[0:p6]);
//
assign Gx[0:p6]    = (Ax[0:p6] & Bx[0:p6]);
assign Px[0:p6]    = (Ax[0:p6] | Bx[0:p6]);
assign Rx[0:p6]    = (Ax[0:p6] ^ Bx[0:p6]);
assign Sx[0:p6]    = (Rx[0:p6] ^ CINx[0:p6]);
assign COUTx[0:p6] = (Px[0:p6] & CINx[0:p6]) | (Gx[0:p6]);
//
assign Gw[0:p6]    = (Aw[0:p6] & Bw[0:p6]);
assign Pw[0:p6]    = (Aw[0:p6] | Bw[0:p6]);
assign Rw[0:p6]    = (Aw[0:p6] ^ Bw[0:p6]);
assign Sw[0:p6]    = (Rw[0:p6] ^ CINw[0:p6]);
assign COUTw[0:p6] = (Pw[0:p6] & CINw[0:p6]) | (Gw[0:p6]);
//
assign PP[0:p6]   = Pw[0:p6]   & Px[0:p6]     & Py[0:p6]   & Pz[0:p6];
assign COUT[0:p6] = (~PP[0:p6] & COUTw[0:p6]) | (PP[0:p6] & CIN[0:p6]);
assign CCOUT      = COUT[0]
//
assign St[0:31] = {Sw[00], Sx[00], Sy[00], Sz[00],
                   Sw[01], Sx[01], Sy[01], Sz[01],
                   Sw[02], Sx[02], Sy[02], Sz[02],
                   Sw[03], Sx[03], Sy[03], Sz[03],
                   Sw[04], Sx[04], Sy[04], Sz[04],
                   Sw[05], Sx[05], Sy[05], Sz[05],
                   Sw[06], Sx[06], Sy[06], Sz[06],
                   Sw[07], Sx[07], Sy[07], Sz[07]};
assign S[0:w26] = St[0:26];
//
endmodule // FPADD32_ADD32
//
```

FIG. 11D

Right-shift module/circuit for FPADD32 embodiment

```
// RS32 module (continuous assignment)
//
module FPADD32_RS32 (D, RS, RSgeM, Q);
//
// input and output ports
input  [0:w26]  D;
input  [4: 0]   RS;
input           RSgeM;
output [0:w26]  Q;
//
wire [4: 0]     STK;
wire [0:w26]    RS4_mux;
wire [0:w26]    RS3_mux;
wire [0:w26]    RS2_mux;
wire [0:w26]    RS1_mux;
wire [0:w26]    RS0_mux;
//////////////////////////////////////////////////////////////////////
//
// FPADD32 - RS0-RS31 shifting option
//
assign RS4_mux[ 0:w26]  = RS[4] ?  {16'h0000,     D[0:w10]} : D[ 0:w26];
assign RS3_mux[ 0:w26]  = RS[3] ?  {8'h00, RS4_mux[0:w18]} : RS4_mux[ 0:w26];
assign RS2_mux[ 0:w26]  = RS[2] ?  {4'h0,  RS3_mux[0:w22]} : RS3_mux[ 0:w26];
assign RS1_mux[ 0:w26]  = RS[1] ?  {2'h0,  RS2_mux[0:w24]} : RS2_mux[ 0:w26];
assign RS0_mux[ 0:w26]  = RS[0] ?  {1'h0,  RS1_mux[0:w25]} : RS1_mux[ 0:w26];
assign        Q[0:w25]  = RS0_mux[0:w25] & {w26{~RSgeM}} ;
// sticky logic
assign STK[4] = ((|{        D[w11:w26]}) & RS[4]) | 1'b0;
assign STK[3] = ((|{RS4_mux[w19:w26]}) & RS[3]) | STK[4];
assign STK[2] = ((|{RS3_mux[w23:w26]}) & RS[2]) | STK[3];
assign STK[1] = ((|{RS2_mux[w25:w26]}) & RS[1]) | STK[2];
assign STK[0] = ((|{RS1_mux[w26]})     & RS[0]) | STK[1];
assign Q[w26] =     RS0_mux[w26] |        RSgeM | STK[0] ;
//
```

FIG. 13A

Right-shift module/circuit for FPADD24 embodiment

```
module FPADD24_RS18 (D, RS, RSgeM, Q);
//
// input and output ports
input  [0:w26]  D;
input  [4: 0]   RS;
input           RSgeM;
output [0:w26]  Q;
//
wire [4: 0]     STK;        // was STK[5:0]  ????
wire [0:w26]    RS4_mux;
wire [0:w26]    RS3_mux;
wire [0:w26]    RS2_mux;
wire [0:w26]    RS1_mux;
wire [0:w26]    RS0_mux;
/////////////////////////////////////////////////////////////
//
// FPADD24 - RS0-RS17 shifting option
//
assign RS3_mux[ 0:w26]  = RS[3] ?  {8'h00,       D[0:w18]} :      D[ 0:w26];
assign RS2_mux[ 0:w26]  = RS[2] ?  {4'h0,  RS3_mux[0:w22]} : RS3_mux[ 0:w26];
assign RS1_mux[ 0:w26]  = RS[1] ?  {2'h0,  RS2_mux[0:w24]} : RS2_mux[ 0:w26];
assign RS0_mux[ 0:w26]  = RS[0] ?  {1'h0,  RS1_mux[0:w25]} : RS1_mux[ 0:w26];
assign RS4_mux[ 0:w26]  = RS[4] ?  {2'h0,  RS0_mux[0:w24]} : RS0_mux[ 0:w26];
assign        Q[0:w25]  = RS4_mux[0:w25] & {w26{~RSgeM}} ;
// sticky logic
assign STK[3] = ((|{      D[w19:w26]}) & RS[3]) | 1'b0;
assign STK[2] = ((|{RS3_mux[w23:w26]}) & RS[2]) | STK[3];
assign STK[1] = ((|{RS2_mux[w25:w26]}) & RS[1]) | STK[2];
assign STK[0] = ((|{RS1_mux[w26]})     & RS[0]) | STK[1];
assign STK[4] = ((|{RS0_mux[w25:w26]}) & RS[4]) | STK[0];
assign Q[w26] =     RS4_mux[w26] |       RSgeM  | STK[4] ;
```

FIG. 13B

Module/Circuit to generate control signals of right-shift module/circuit for FPADD32 and FPADD24 embodiments

```
// Generate right shift amount, and check
// for >RS0/RS1 case, and >RS31 case
// Note that M=32 for FPADD32
wire [4:0]  RSa    = EAgeEB ?   EU[4:0]   :
                                EV[4:0]   ;
wire        RSge2  = EAgeEB ? |{EU[7:1]} :
                              |{EV[7:1]} ;
wire        RSgeM  = EAgeEB ? |{EU[7:5]} :
                              |{EV[7:5]} ;
//
//////////////////////////////////////////////////////////////////
//
// Right shift control for FPADD24
//
// Generate right shift amount, and check
// for >RS0/RS1 case, and >RS17 case -
// Note that M=18 for FPADD24
wire        EU015  = ~|{EU[7:4]};
wire        EV015  = ~|{EV[7:4]};
wire        EU1617 = ~|{EU[7:5],~EU[4],EU[3:1]};
wire        EV1617 = ~|{EV[7:5],~EV[4],EV[3:1]};
wire        EUgeM  = ~|{EU015,EU1617};
wire        EVgeM  = ~|{EV015,EV1617};
wire [4:0]  RSa    = EAgeEB ?   {1'b0,EU[3:0]} | {{4{~EU015}}, 1'b0} :
                                {1'b0,EV[3:0]} | {{4{~EV015}}, 1'b0} ;
wire        RSge2  = EAgeEB ? |{EU[7:1]} :
                              |{EV[7:1]} ;
wire        RSgeM  = EAgeEB ? EUgeM : EVgeM;
//
```

FIG. 13C

MULTIPLY-ACCUMULATE WITH VARIABLE FLOATING POINT PRECISION

RELATED APPLICATIONS

This application is a divisional of U.S. application Ser. No. 16/900,319 filed Jun. 12, 2020, which claims the filing-date benefit of U.S. Application No. 62/865,113 filed Jun. 21, 2019. Each of the foregoing patent applications is hereby incorporated herein by reference in its entirety.

INTRODUCTION

There are many inventions described and illustrated herein. The present inventions are neither limited to any single aspect nor embodiment thereof, nor to any combinations and/or permutations of such aspects and/or embodiments. Importantly, each of the aspects of the present inventions, and/or embodiments thereof, may be employed alone or in combination with one or more of the other aspects of the present inventions and/or embodiments thereof. All combinations and permutations thereof are intended to fall within the scope of the present inventions.

In one aspect, the present inventions are directed to one or more integrated circuits having multiplier-accumulator circuitry (and methods of operating such circuitry) for data processing (e.g., image filtering) wherein the multiplier circuitry and/or the accumulator circuitry thereof implement the multiplication and/or accumulation operations, respectively, using floating point data and/or based on a floating point data format. In one embodiment, the floating point data format of the multiplier circuitry is the same as the floating point data format of the accumulator circuitry (e.g., such as 16, 24 and 32 bits). In another embodiment, the floating point data format of the multiplier circuitry is different from the floating point data format of the accumulator circuitry. For example, the multiplier circuitry may include a 16 bit floating point multiplier and the accumulator circuitry may include a 24 or 32 bit floating point adder or accumulator.

Notably, the multiplier-accumulator circuitry of the present inventions may be implemented in an execution or processing pipeline including execution circuitry employing one or more floating point data formats. Here, the multiplier circuitry may be a floating point multiplier and/or the accumulator circuitry may be a floating point accumulator. In one embodiment, the execution or processing pipeline includes a plurality of multiplier-accumulator circuits, each circuit including a floating point multiplier and/or a floating point accumulator. For example, the plurality of multiplier-accumulator circuits (each having floating point processing circuitry) may be interconnected (in series) to perform the multiply and accumulate operations and/or the pipelining architecture or configuration implemented via connection of multiplier-accumulator circuits. In this pipeline architecture, for example, the plurality of multiplier-accumulator circuits may concatenate the multiply and accumulate operations of the data processing.

The floating point data formats may be user or system defined and/or may be one-time programmable (e.g., at manufacture) or more than one-time programmable (e.g., (i) at or via power-up, start-up or performance/completion of the initialization sequence/process sequence, and/or (ii) in situ or during normal operation). In one embodiment, the execution circuitry (e.g., the multipliers and/or the accumulators) of the data processing pipelines includes adjustable/ programmable floating point precision—which is one-time programmable (e.g., at manufacture) or more than one-time programmable.

In addition thereto, or in lieu thereof, the processing circuitry of the execution pipelines may concurrently process data to increase throughput of the pipeline. For example, in one implementation, the present inventions may include a plurality of separate multiplier-accumulator circuits (referred to herein, at times, as "MAC" or "MAC circuits") and a plurality of registers (including, in one embodiment, a plurality of shadow registers) that facilitate pipelining of the multiply and accumulate operations wherein the circuitry of the execution pipelines concurrently process data to increase throughput of the pipeline.

Notably, the present inventions may employ and/or be implemented in conjunction with the circuitry and techniques described and/or illustrated in U.S. patent application Ser. No. 16/545,345 and U.S. Provisional Patent Application No. 62/725,306. Here, the multiplier-accumulator circuitry described and/or illustrated in the '345 and '306 applications facilitate concatenating the multiply and accumulate operations, and reconfiguring the circuitry thereof and operations performed thereby (see, e.g., the exemplary embodiments illustrated in FIGS. 1A-1C of U.S. patent application Ser. No. 16/545,345); in this way, a plurality of multiplier-accumulator circuits may be configured and/or re-configured to process data (e.g., image data) in a manner whereby the processing and operations are performed more rapidly and/or efficiently. The '345 and '306 applications are incorporated by reference herein in their entirety.

Further, the present inventions may also be employed or be implemented in conjunction with the circuitry and techniques multiplier-accumulator execution or processing pipelines (and methods of operating such circuitry) having circuitry to implement Winograd type processes to increase data throughput of the multiplier-accumulator circuitry and processing—for example, as described and/or illustrated in U.S. patent application Ser. No. 16/796,111 and U.S. Provisional Patent Application No. 62/823,161, both of which are hereby incorporated by reference in its entirety.

In addition thereto, or in lieu thereof, the present inventions may also be employed and/or be implemented in conjunction with the circuitry and techniques multiplier-accumulator execution or processing pipelines (and methods of operating such circuitry) having circuitry and/or architectures to process data, concurrently or in parallel, to increase throughput of the pipeline—for example, as described and/or illustrated in U.S. patent application Ser. No. 16/816,164 and U.S. Provisional Patent Application No. 62/831,413; the '164 and '413 applications are hereby incorporated by reference in its entirety. Here, a plurality of processing or execution pipelines may concurrently process data to increase throughput of the data processing and overall pipeline.

Notably, the integrated circuit(s) may be, for example, a processor, controller, state machine, gate array, system-on-chip (SOC), programmable gate array (PGA) and/or FPGA and/or a processor, controller, state machine and SoC including an embedded FPGA. A field programmable gate array or FPGA means both a discrete FPGA and an embedded FPGA.

BRIEF DESCRIPTION OF THE DRAWINGS

The present inventions may be implemented in connection with embodiments illustrated in the drawings hereof. These drawings show different aspects of the present inventions and, where appropriate, reference numerals, nomenclature, or names illustrating like circuits, architectures, structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

Notably, the configurations, block/data width, data path width, bandwidths, data lengths, values, processes, pseudo-code, operations, and/or algorithms described herein and/or illustrated in the FIGURES, and text associated therewith, are exemplary. Indeed, the inventions are not limited to any particular or exemplary circuit, logical, block, functional and/or physical diagrams, number of multiplier-accumulator circuits employed in an execution pipeline, number of execution pipelines employed in a particular processing configuration, organization/allocation of memory, block/data width, data path width, bandwidths, values, processes, pseudo-code, operations, and/or algorithms illustrated and/or described in accordance with, for example, the exemplary circuit, logical, block, functional and/or physical diagrams.

Moreover, although the illustrative/exemplary embodiments include a plurality of memories (e.g., L3 memory, L2 memory, L1 memory, L0 memory) which are assigned, allocated and/or used to store certain data and/or in certain organizations, one or more of memories may be added, and/or one or more memories may be omitted and/or combined/consolidated—for example, the L3 memory or L2 memory, and/or the organizations may be changed, supplemented and/or modified. The inventions are not limited to the illustrative/exemplary embodiments of the memory organization and/or allocation set forth in the application. Again, the inventions are not limited to the illustrative/exemplary embodiments set forth herein.

Figure 1A:
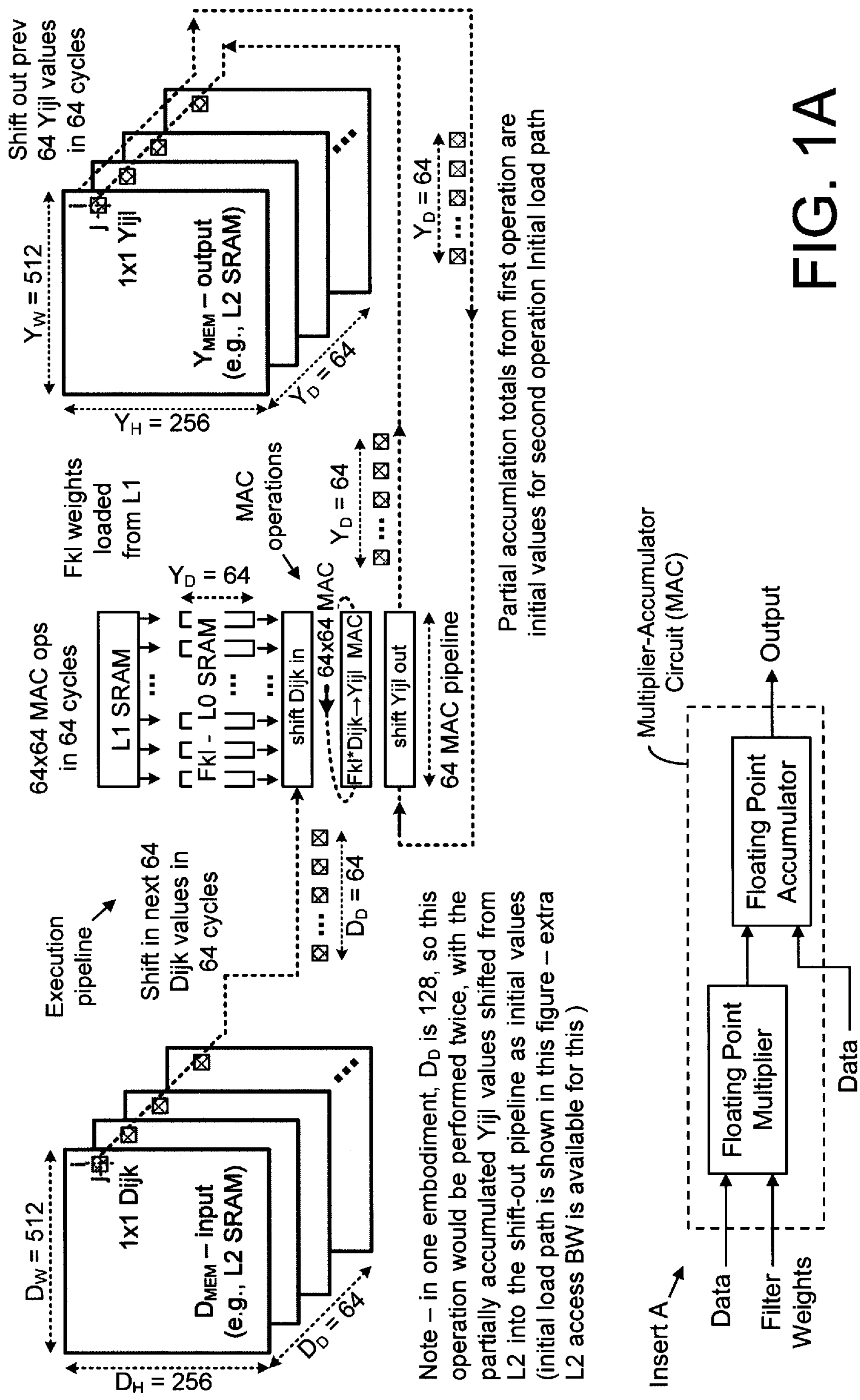
Figure 1B:
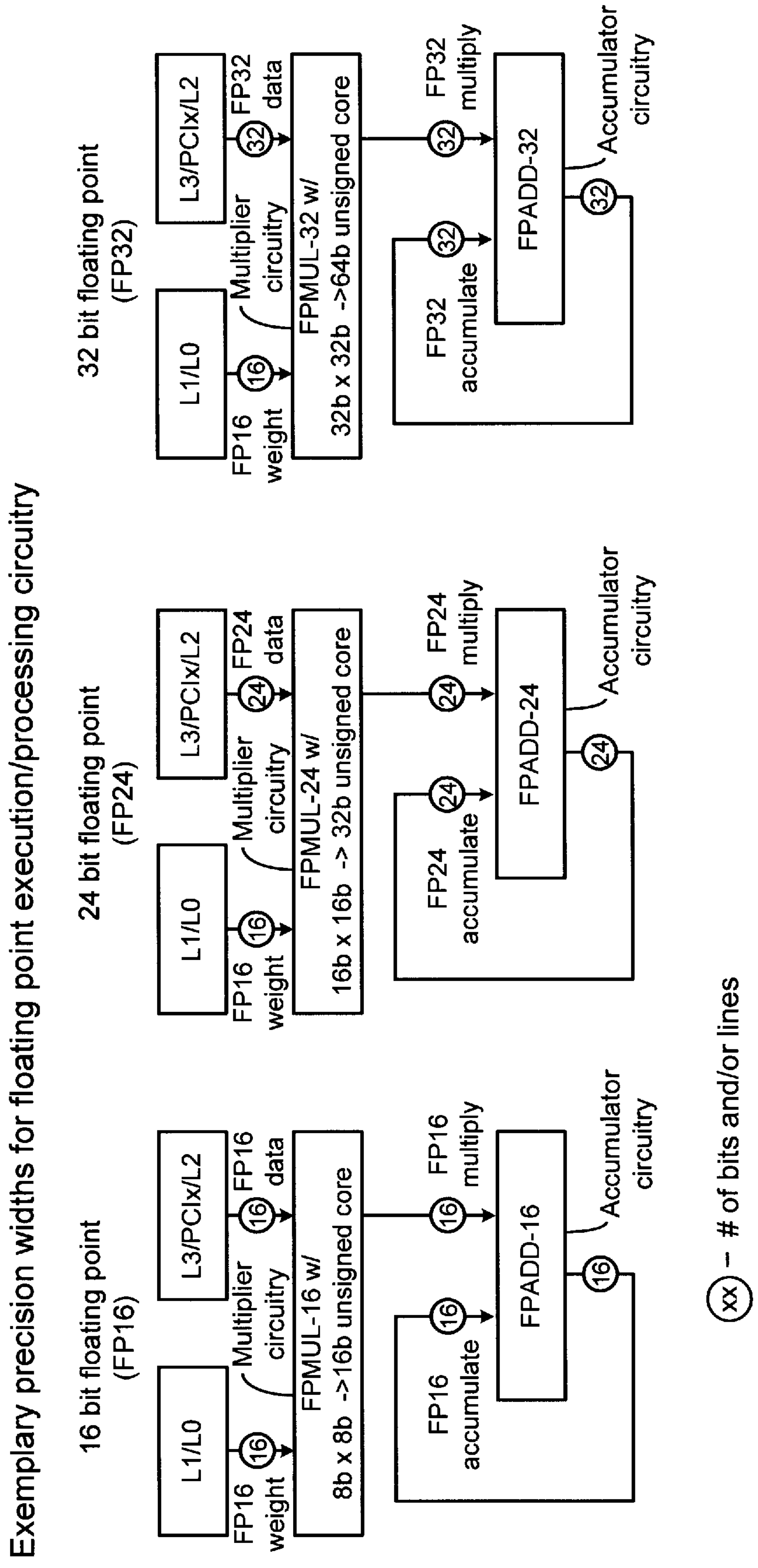

FIG. 1A is a schematic block diagram of a logical overview of an exemplary multiplier-accumulator execution pipeline connected in a linear pipeline configuration, according to one or more aspects of the present inventions, wherein the multiplier-accumulator processing or execution pipeline ("MAC pipeline") includes multiplier-accumulator circuitry ("MAC"), which is illustrated in block diagram form; notably, the multiplier-accumulator circuitry includes one or more of the multiplier-accumulator circuits (an exemplary multiplier-accumulator circuit is illustrated in schematic block diagram form in Inset A); in this exemplary embodiment, 'r' (e.g., 64 in the illustrative embodiment) multiplier-accumulator circuits are connected in a linear execution pipeline to operate concurrently whereby the processing circuits perform r×r (e.g., 64×64) multiply-accumulate operations in each r (e.g., 64) cycle interval (here, a cycle may be nominally 1 ns); notably, each r (e.g., 64) cycle interval processes a Dd/Yd (depth) column of input and output pixels/data at a particular (i,j) location (the indexes for the width Dw/Yw and height Dh/Yh dimensions of this exemplary embodiment—Dw=512, Dh=256, and Dd=128, and the Yw=512, Yh=256, and Yd=64) wherein the r (e.g., 64) cycle execution interval is repeated for each of the Dw*Dh depth columns for this stage; in addition, in one embodiment, the filter weights or weight data are loaded into memory (e.g., L1/L0—such as SRAM memory(ies)) before the multiplier-accumulator circuitry starts processing (see, e.g., the '345 and '306 applications);

FIG. 1B illustrate a plurality of exemplary functional block diagrams of exemplary multiplier-accumulator circuitry employing floating point execution circuitry having different formats (here, different floating point precision widths—such as 16, 24 and 32 bits), according to certain aspects of the present invention; in one embodiment, the precision employed by the floating point multiplier and/or the floating point accumulator may depend upon the memory bandwidth available/allocated, wiring bandwidth available/allocated, and/or the amount of area available/allocated to the floating point circuitry of the processing circuitry to store, transfer/read and/or process data (e.g., data partially processed and to be processed) within, for example, an integrated circuit; notably, the present inventions may be implemented via floating point execution circuitry that maybe configured with the same precision width or different precision widths; as noted above, in one embodiment, the floating point data format of the multiplier circuitry is the same as the floating point data format of the accumulator circuitry (e.g., the multiplier and accumulator both implement a floating point format of, for example, 16, 24 and 32 bits); alternatively, the floating point data format of the multiplier circuitry is different from the floating point data format of the associated accumulator circuitry of the multiplier-accumulator circuit (e.g., the multiplier may employ/implement a 16 bit floating point format and the accumulator may employ/implement a 24 bit floating point format; the multiplier-accumulator circuitry of the present inventions may be implemented in an execution or processing pipeline including execution circuitry employing one or more floating point data formats. Here, the multiplier circuitry may be a floating point multiplier and/or the accumulator circuitry may be a floating point accumulator. In one embodiment, the execution or processing pipeline includes a plurality of multiplier-accumulator circuits, each circuit including a floating point multiplier and/or a floating point accumulator. For example, the plurality of multiplier-accumulator circuits (each having floating point processing circuitry) may be interconnected (in series) to perform the multiply and accumulate operations and/or the pipelining architecture or configuration implemented via connection of multiplier-accumulator circuits. In this pipeline architecture, for example, the plurality of multiplier-accumulator circuits may concatenate the multiply and accumulate operations of the data processing.

Figure 1C:
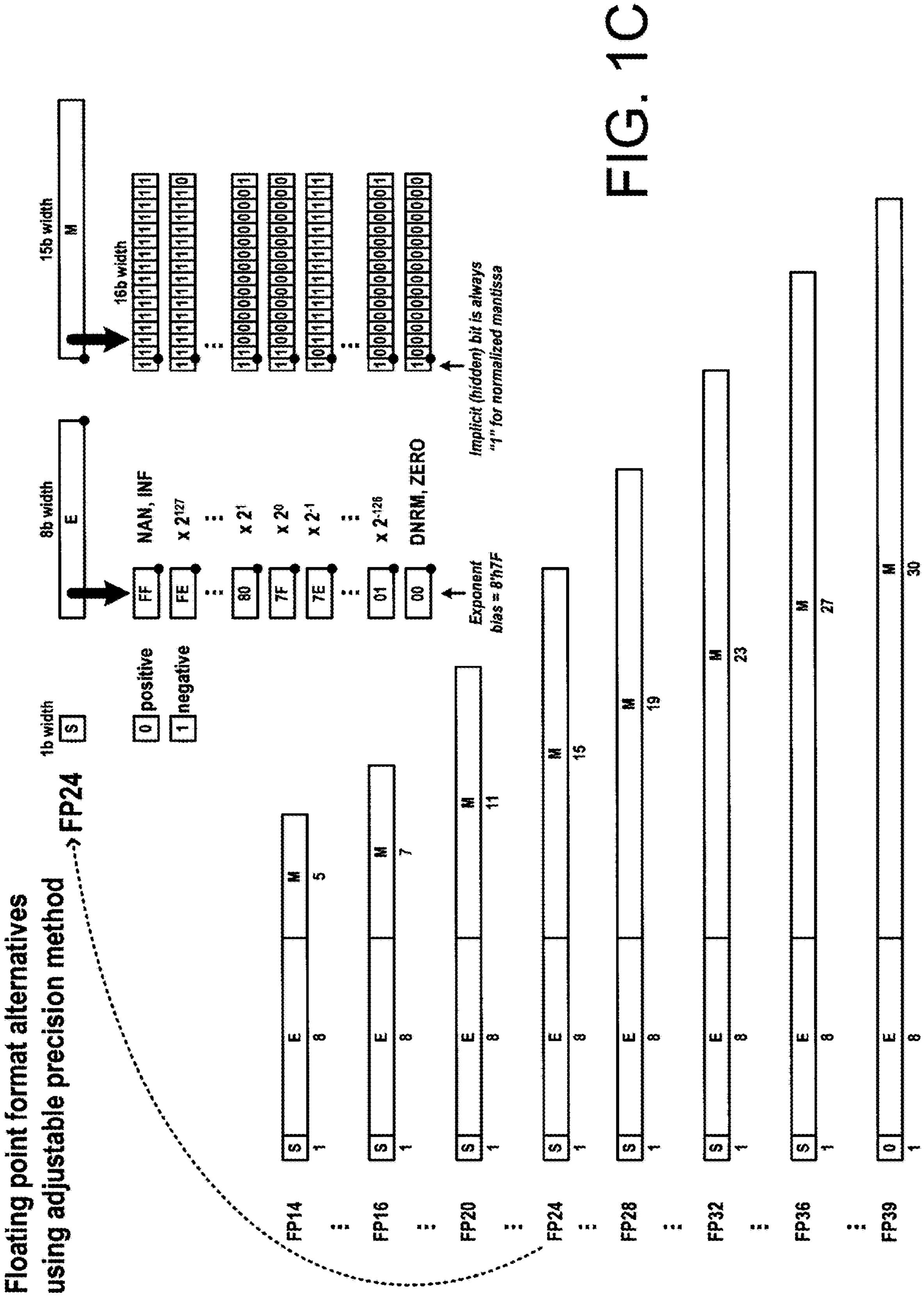
Figure 1D:
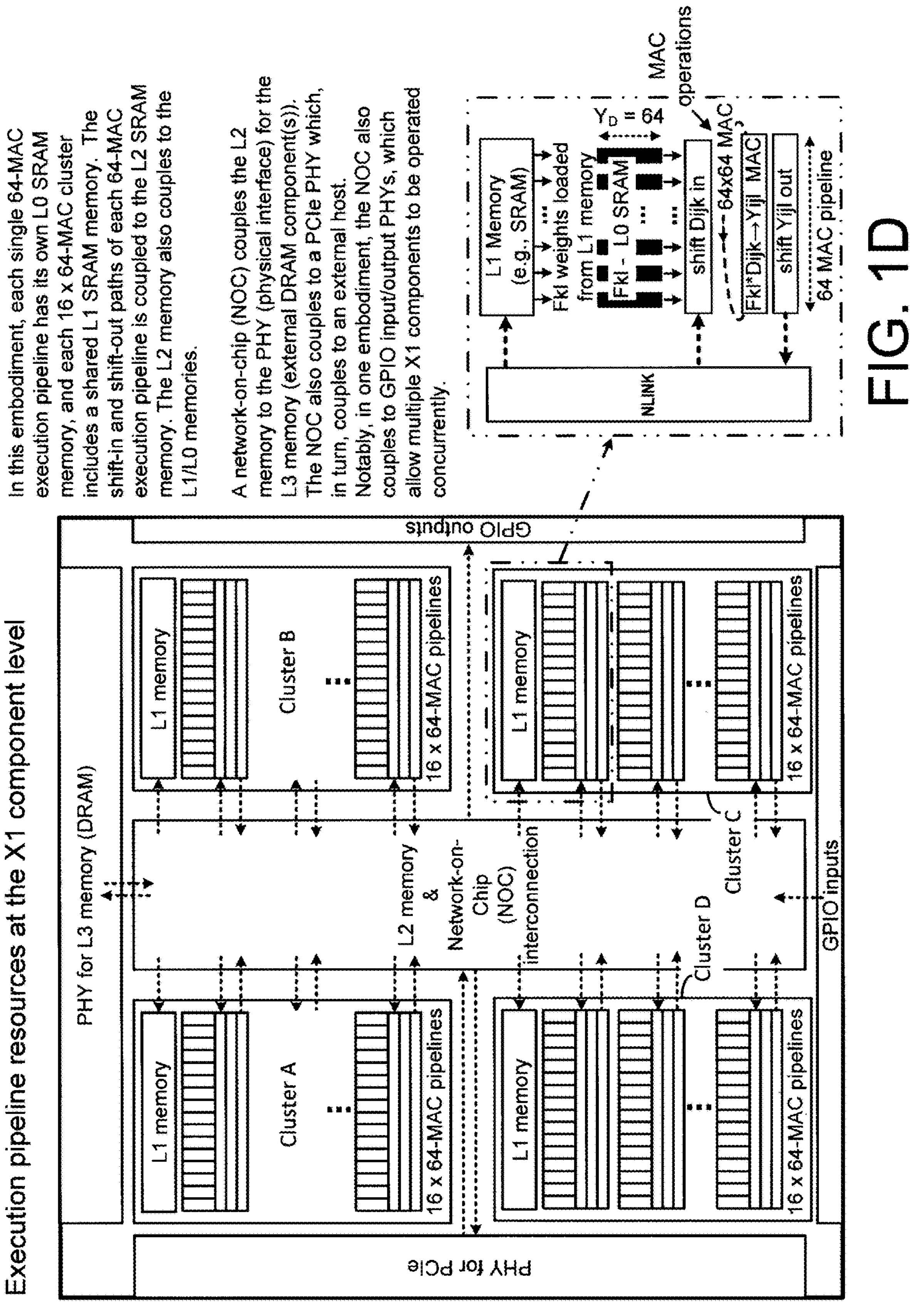
Figure 2A:
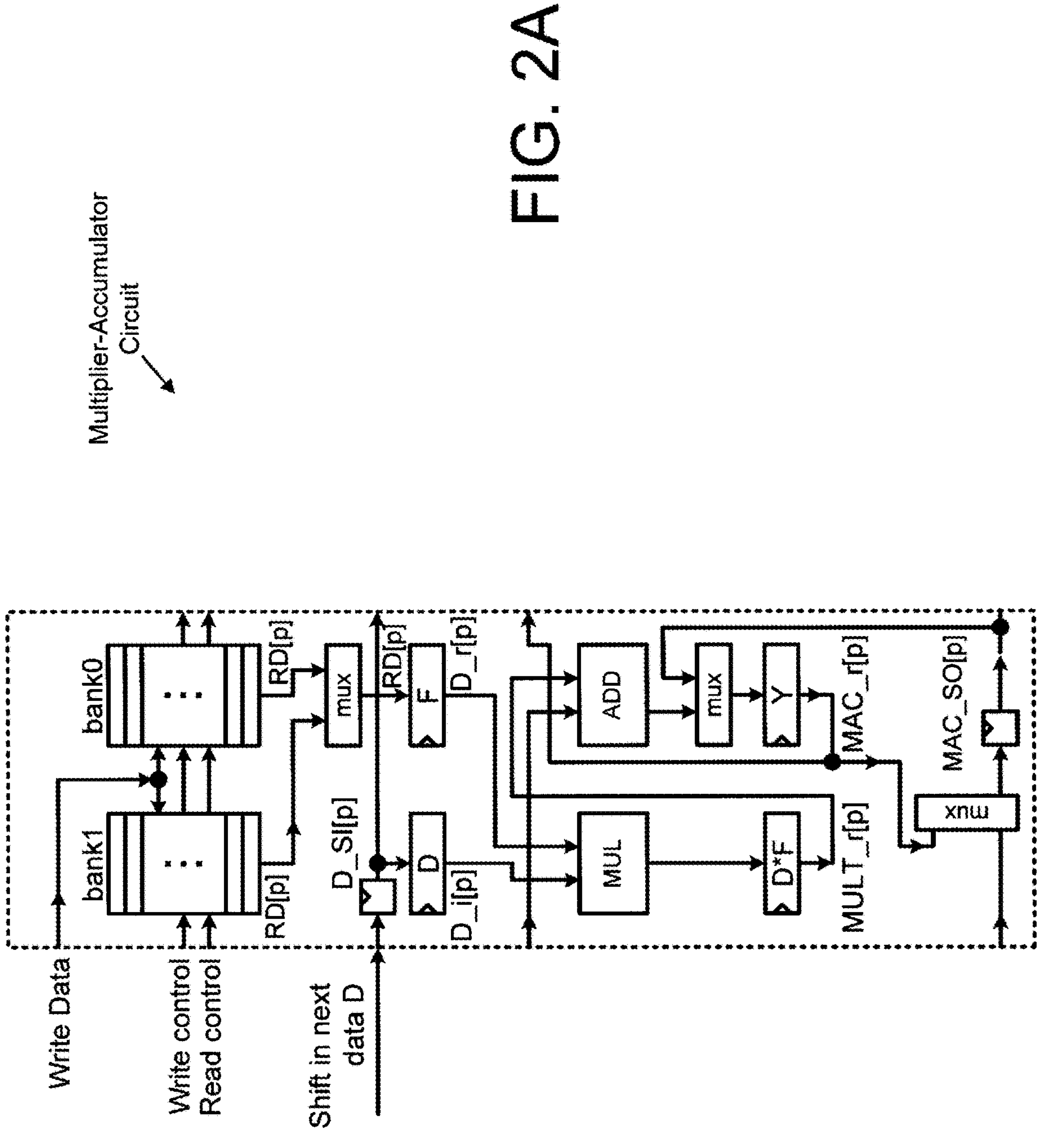
Figure 2B:
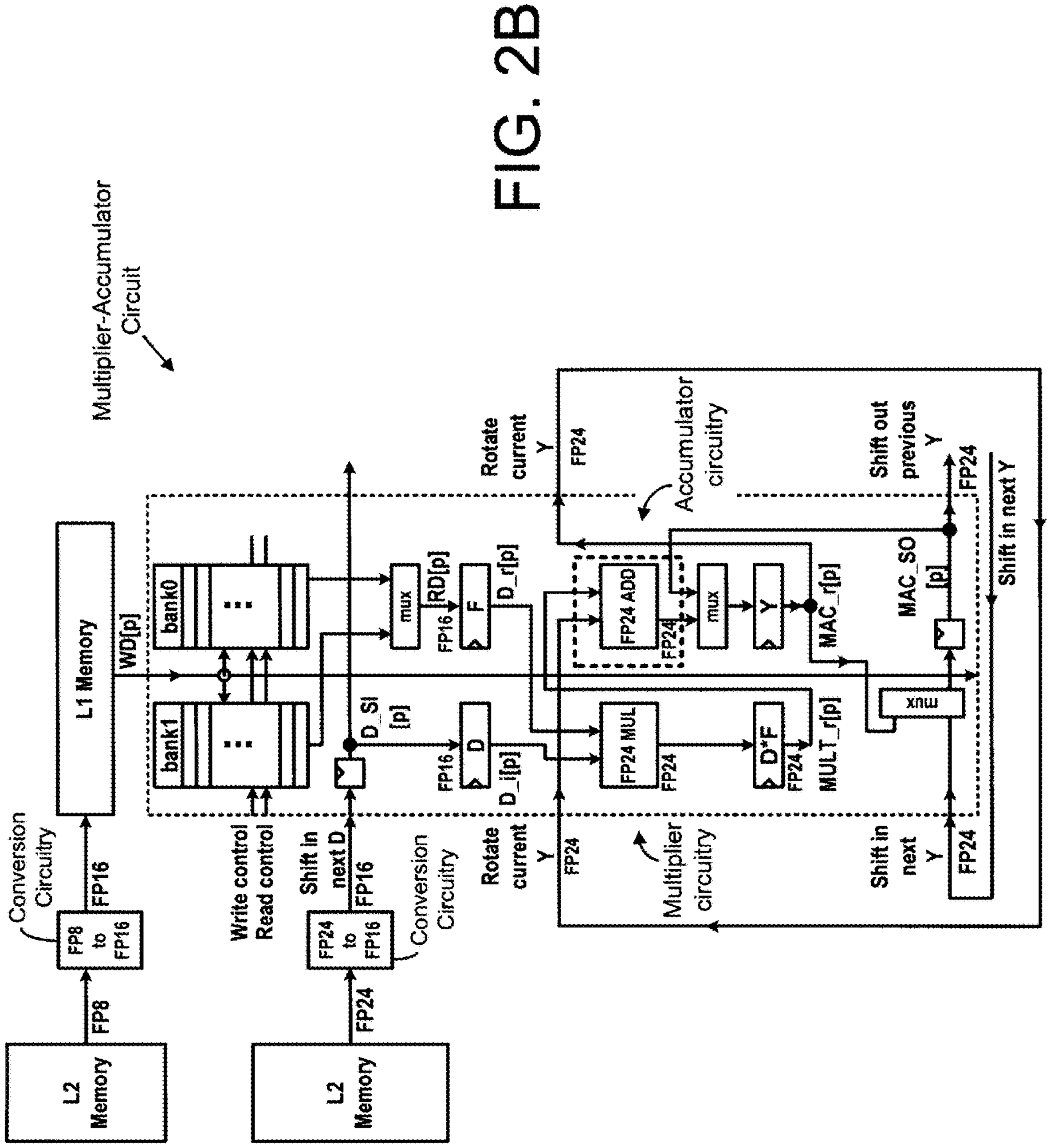
Figure 2C:
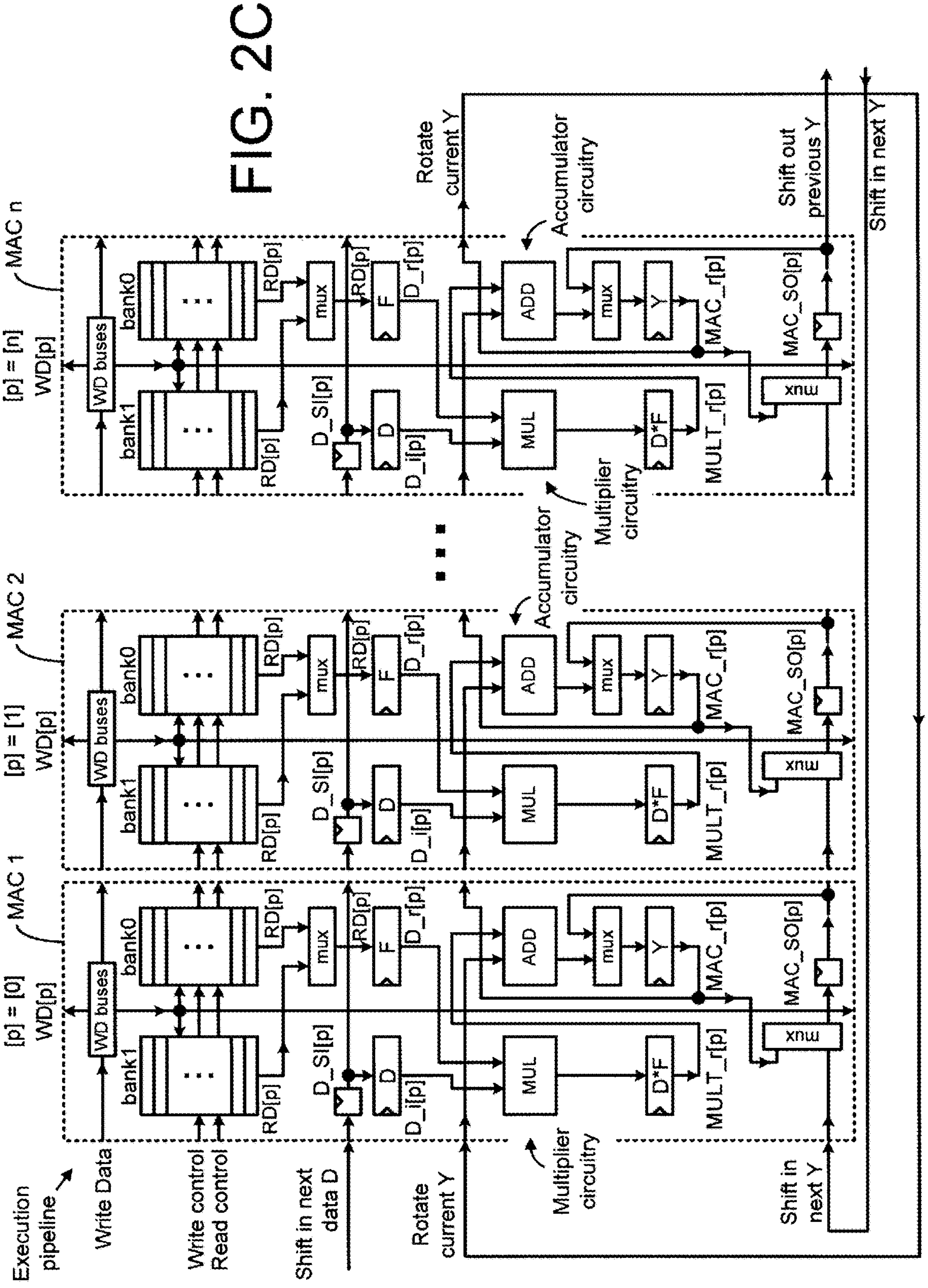
Figure 3A:
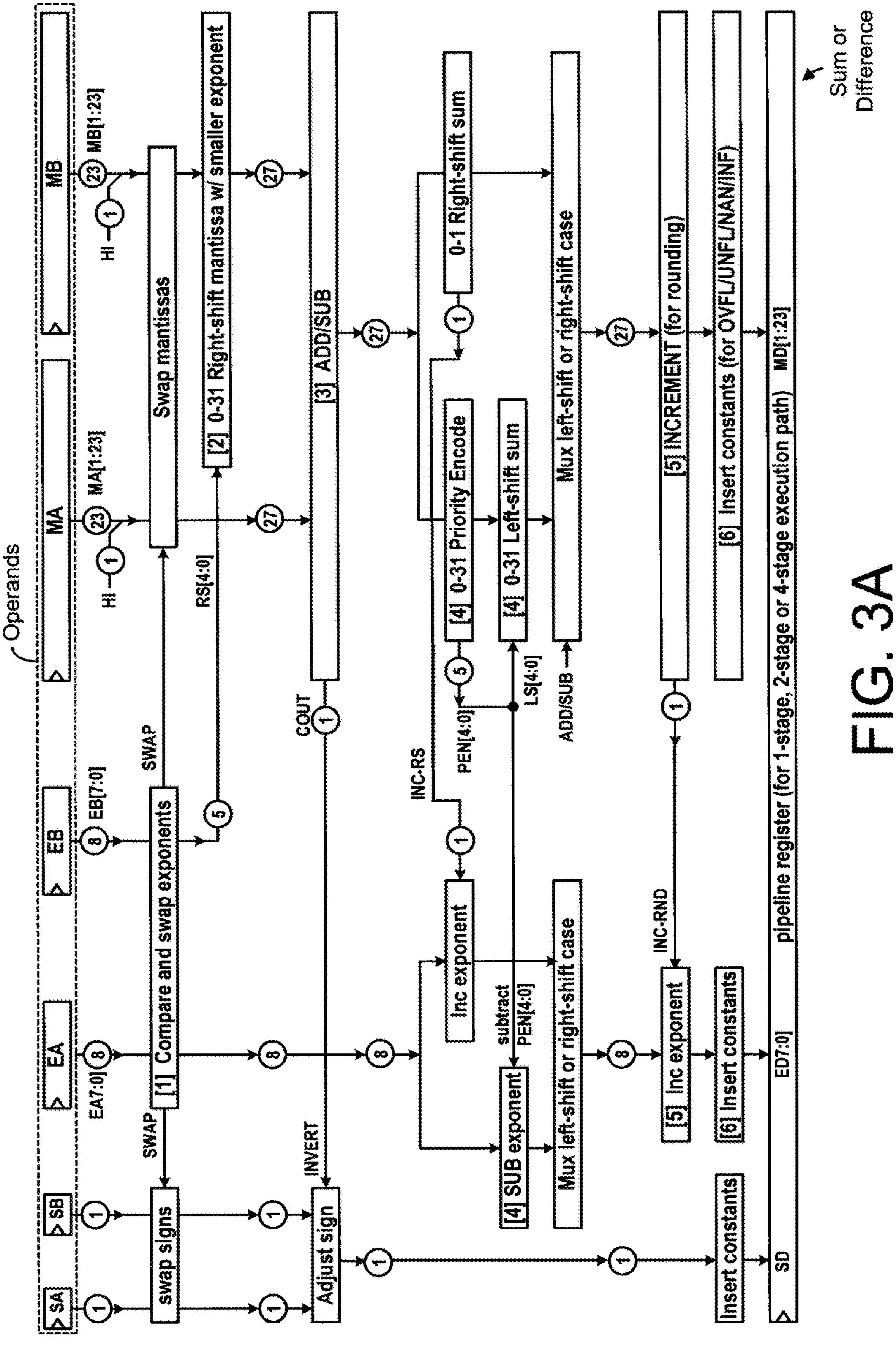
Figure 3B:
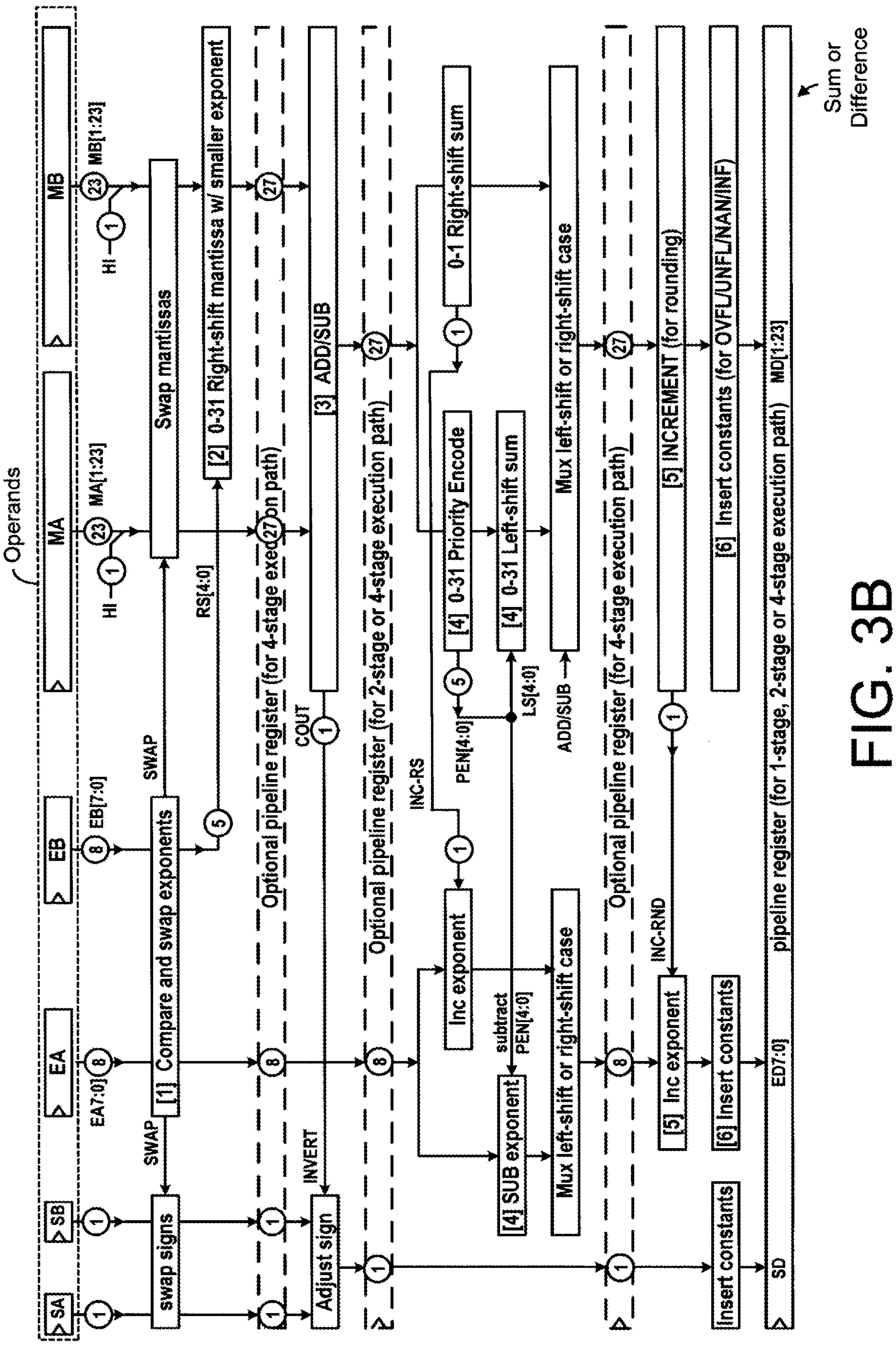
Figure 7A:
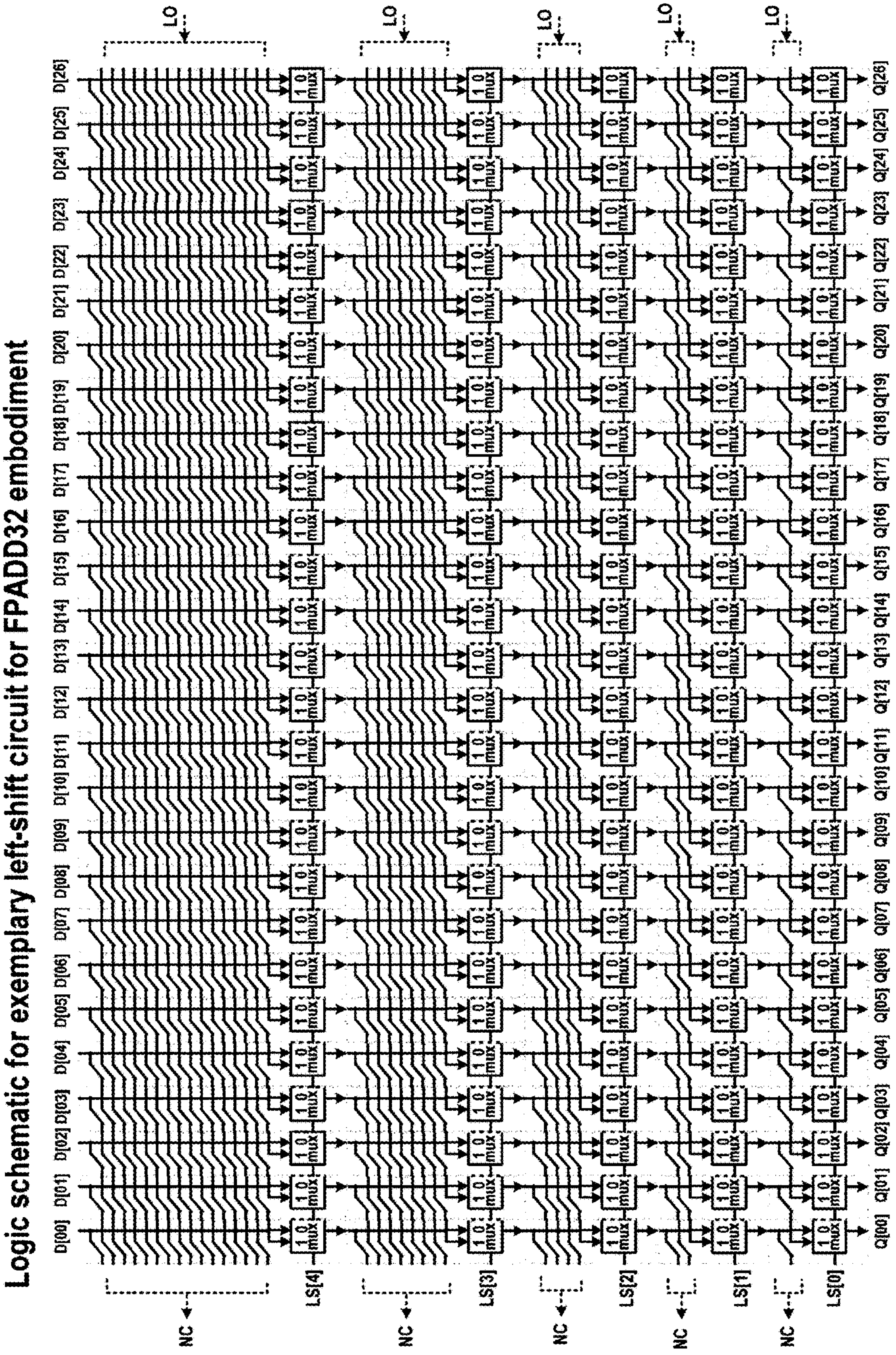
Figure 7B:
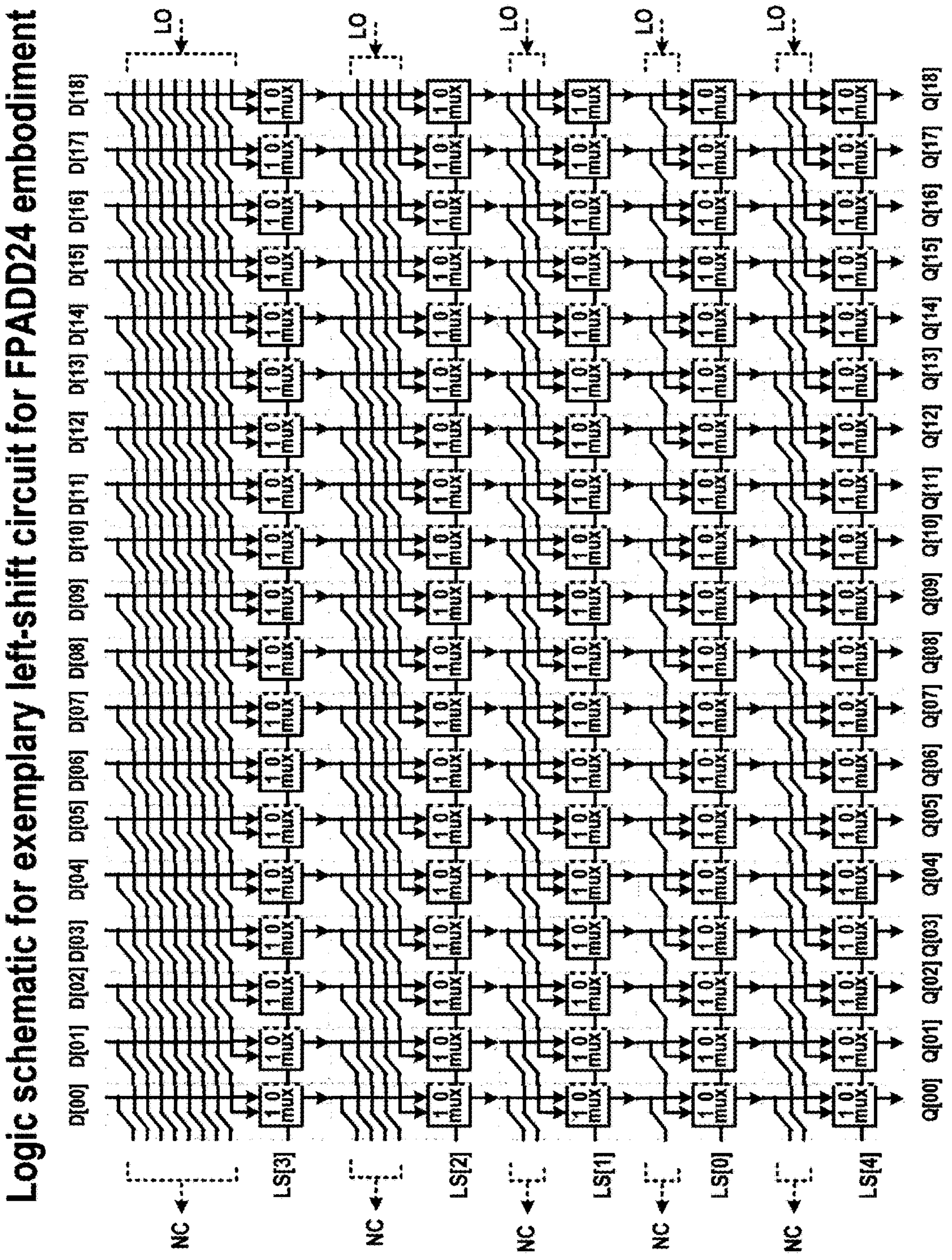
Figure 9:
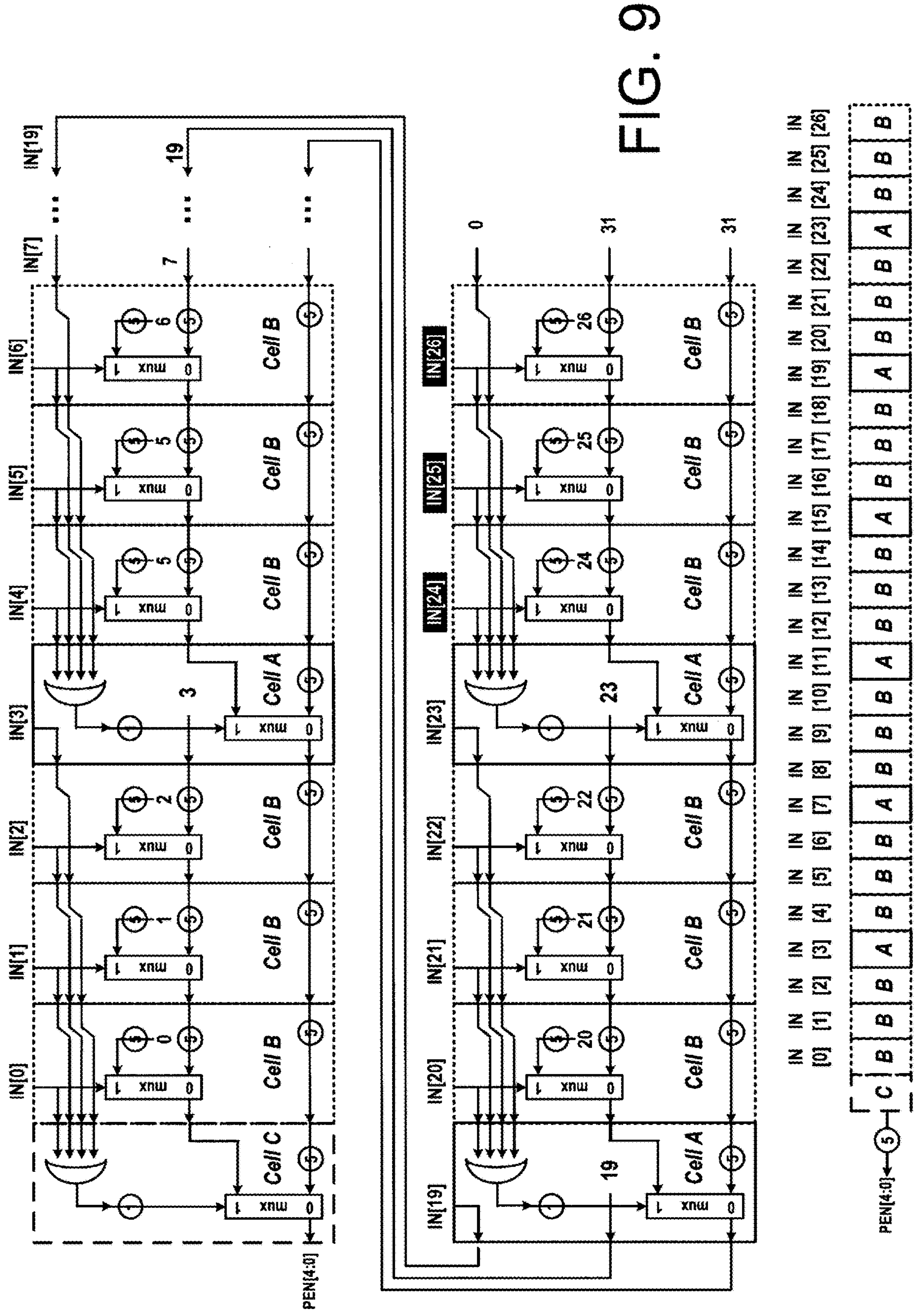
Figure 10A:
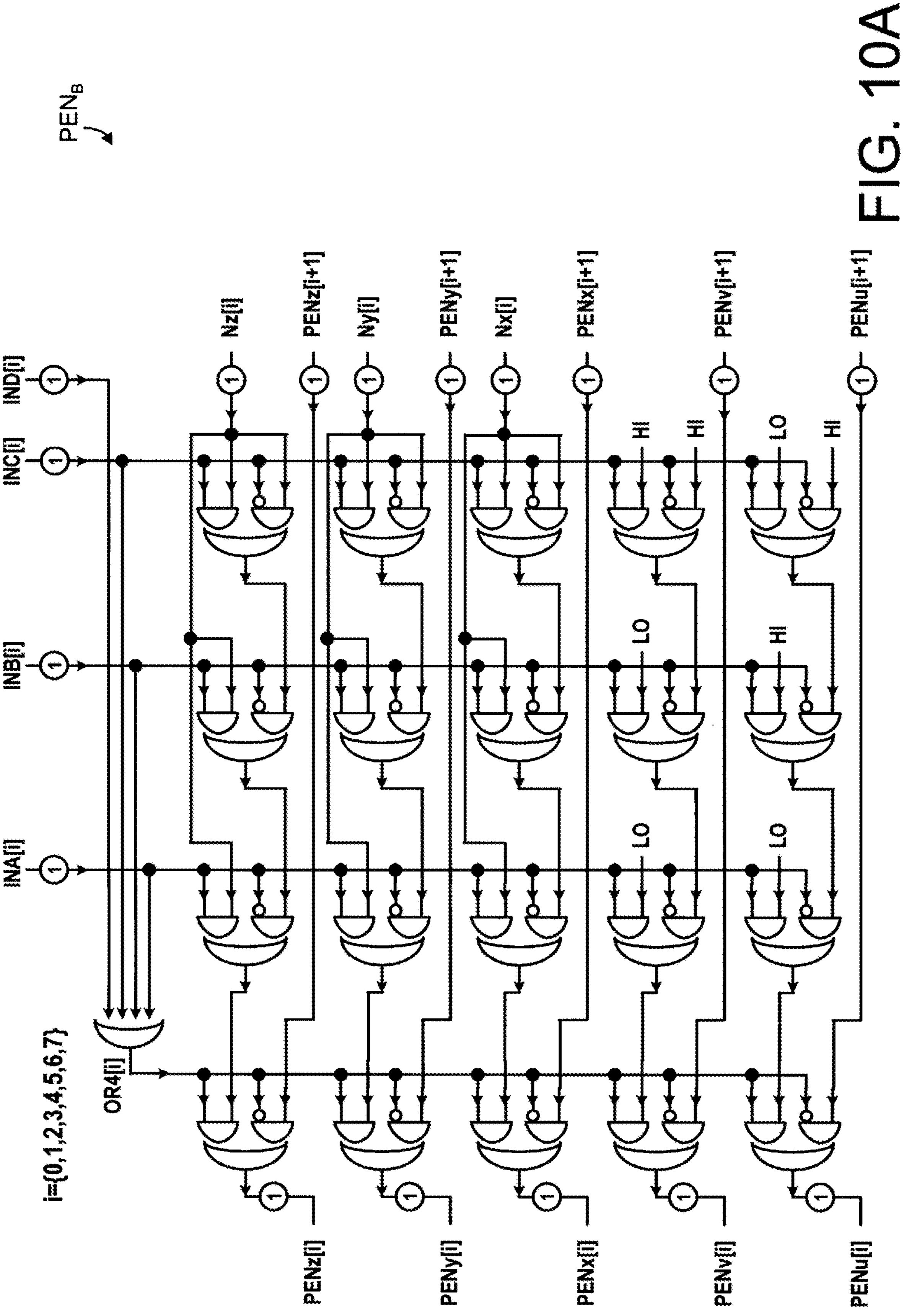
Figure 11A:
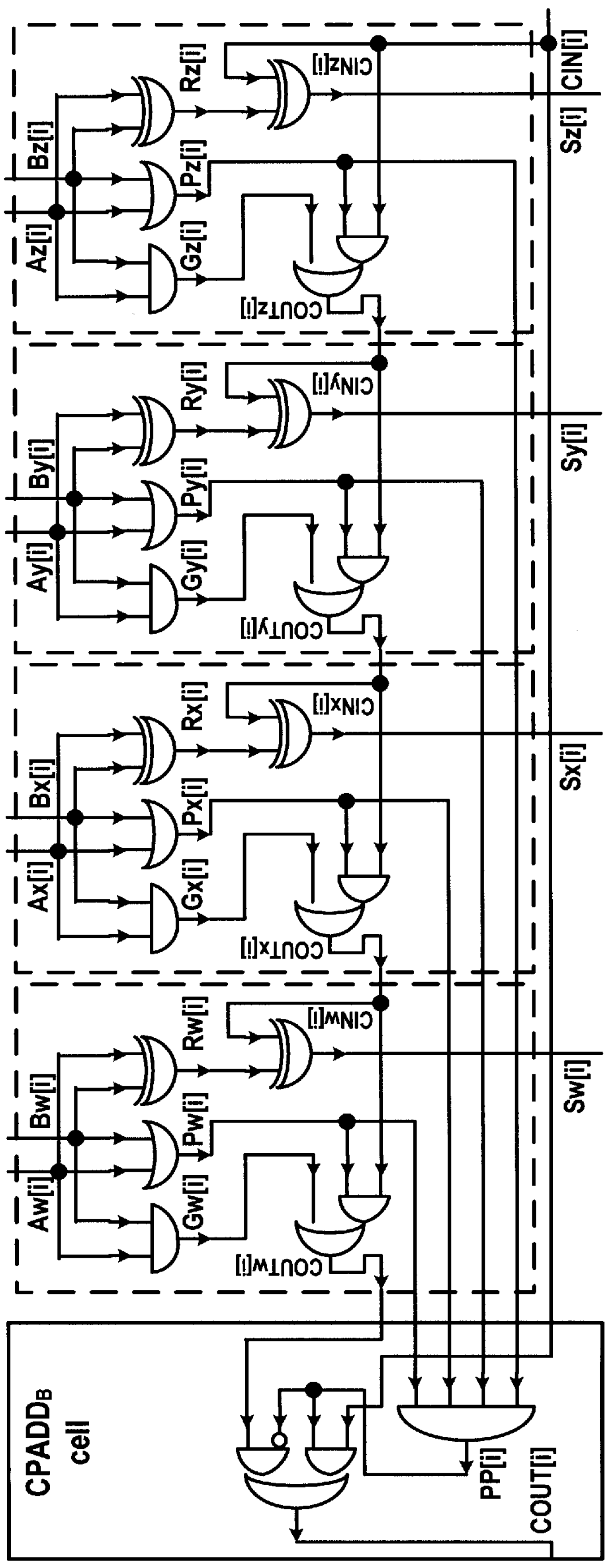
Figure 12:
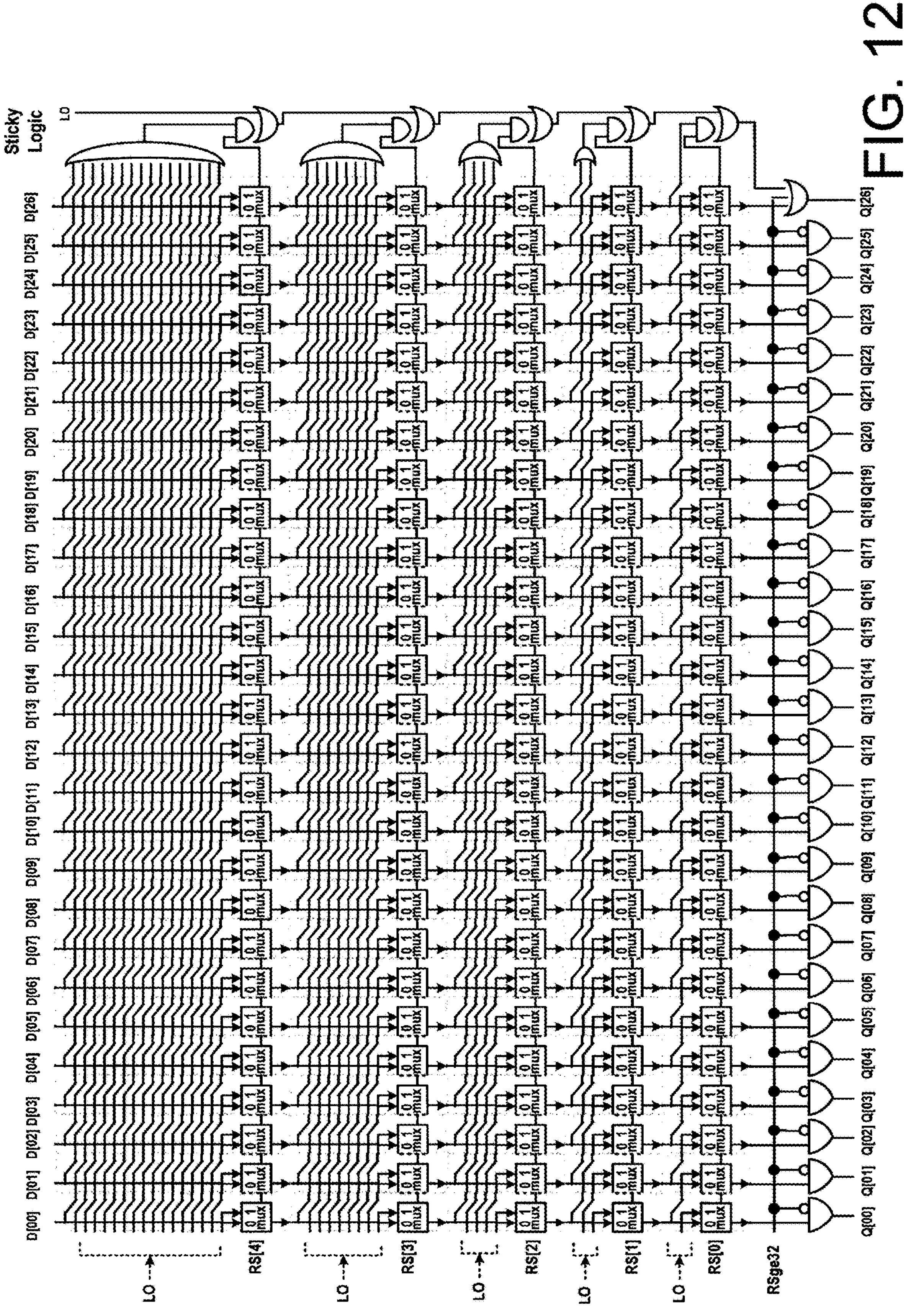

FIG. 1C illustrates exemplary floating point format data formats of different precisions; notable, except for the different mantissa precision widths, the formats are similar to, for example, a standard IEEE 754 32 bit floating point data format;

FIG. 1D is a high-level block diagram layout of an integrated circuit or a portion of an integrated circuit (which may be referred to, at times, as an X1 component) including a plurality of multi-bit MAC execution pipelines having a plurality of multiplier-accumulator circuits each of which implement multiply and accumulate operations, according to certain aspects of the present inventions; the multi-bit MAC execution pipelines and/or the plurality of multiplier-accumulator circuits may be configured to implement one or more processing architectures or techniques (singly or in combination with one or more X1 components); in this illustrative embodiment, the multi-bit MAC execution pipelines are organized into clusters (in this illustrative embodiment, four clusters wherein each cluster includes a plurality of multi-bit MAC execution pipelines (in this illustrative embodiment each cluster includes 16, 64-MAC execution pipelines (which may also be individually referred to below as MAC processors)); in one embodiment, the plurality of multiplier-accumulator circuitry are configurable or programmable (one-time or multiple times, e.g., at start-up and/or in situ) to implement one or more pipelining processing architectures or techniques (see, e.g., the expanded view of a portion of the high-level block diagram of FIG. 1D in the lower right is a single MAC execution pipeline (in the illustrative embodiment, including, e.g., 64 multiplier-accumulator circuits ("MAC")—which may also be referred to as MAC processors) which correlates to the schematic block diagram of a logical overview of an exemplary multiplier-accumulator circuitry arranged in a linear execution pipeline configuration—see FIG. 1A); the processing component in this illustrative embodiment includes memory (e.g., L2 memory, L1 memory and L0 memory (e.g., SRAM)), a bus interfaces (e.g., a PHY and/or GPIO) to facilitate communication with circuitry external to the component and memory (e.g., SRAM and DRAM) for storage and use by the circuitry of the component, and a plurality of switches/multiplexers which are electrically interconnected to form a switch interconnect network "Network-on-Chip" ("NOC") to facilitate interconnecting the clusters of multiplier-accumulator circuits of the MAC execution pipelines; in one embodiment, the NOC includes a switch interconnect network (e.g., a mixed-mode interconnect network (i.e., a hierarchical switch matrix interconnect network and a mesh, torus or the like interconnect network (hereinafter collectively "mesh network" or "mesh interconnect network")), associated data storage elements, input pins and/or look-up tables (LUTs) that, when programmed, determine the operation of the switches/multiplexers; in one embodiment, one or more (or all) of the clusters includes one or more computing elements (e.g., a plurality of multiplier-accumulator circuitry—labeled as "NMAX Rows"—see, e.g., the '345 and '306 applications); notably, in one embodiment, each MAC execution pipeline (which, in one embodiment, consists of a plurality of serially interconnected multiplier-accumulator circuits) is connected to an associated L0 memory (e.g., SRAM memory) that is dedicated to that processing pipeline; the associated L0 memory stores filter weights used by the multiplier circuitry of each multiplier-accumulator circuit of that particular MAC processing pipeline in performance of the multiply operations, wherein each MAC processing pipeline of a given cluster is connected to an associated L0 memory (which, in one embodiment, is dedicated to the multiplier-accumulator circuits of that MAC processing pipeline—in this illustrative embodiment, 64 MACs in the MAC processing pipeline); a plurality (e.g., 16) MAC execution pipelines of a MAC cluster (and, in particular, the L0 memory of each MAC execution pipeline of the cluster) is coupled to an associated L1 memory (e.g., SRAM memory); here, the associated L1 memory is connected to and shared by each of the MAC execution pipelines of the cluster to receive filter weights to be stored in the L0 memory associated with each MAC execution pipeline of the cluster; in one embodiment, the associated L1 memory is assigned and dedicated to the plurality of pipelines of the MAC cluster; notably, the shift-in and shift-out paths of each 64-MAC execution pipeline is coupled to L2 memory (e.g., SRAM memory) wherein the L2 memory also couples to the L1 memory and L0 memory; the NOC couples the L2 memory to the PHY (physical interface) which may connect to L3 memory (e.g., external DRAM); the NOC also couples to a PCIe or PHY which, in turn, may provide interconnection to or communication with circuitry external to the X1 processing component (e.g., an external processor, such as a host processor); the NOC, in one embodiment, may also connect a plurality of X1 components (e.g., via GPIO input/output PHYs) which allow multiple X1 components to process related data (e.g., image data), as discussed herein, in accordance with one or more aspects of the present inventions;

FIG. 2A illustrates a schematic block diagram of an exemplary logical overview of an exemplary multiplier-accumulator circuit including a multiplier circuitry ("MUL") performing operation in a floating point format and/or accumulator circuitry ("ADD") performing operations in a floating point format (e.g., the same floating point format as multiplier circuitry), according to one embodiment of the present inventions; notably, in one embodiment, the multiplier-accumulator circuit may include two dedicated memory banks to store at least two different sets of filter weights—each set of filter weights associated with and used in processing a set of data) wherein each memory bank may be alternately read for use in processing a given set of associated data and alternately written after processing the given set of associated data;

FIG. 2B illustrates a schematic block diagram of an exemplary logical overview of an exemplary multiplier-accumulator execution or processing circuit, according to one embodiment of the present inventions, including multiplier circuitry (MUL) performing operation in a 24 bit floating point format (FP24 MUL) and the accumulator circuitry (ADD) performing operation in a 24 bit floating point format (FP24 ADD); notably, the bit width of the processing circuitry and operations are exemplary—that is, in this illustrative embodiment, the data and filter weights are in a 16 bit floating point data format (FP16) wherein, in this embodiment, conversion circuitry changes or modifies (e.g., increases or decreases) the bit width of the input data and filter weights; as indicated above, the floating point multiplier and the floating point accumulator perform operations in a 24 bit floating point data format (FP24); other floating point formats or width precisions are applicable (e.g., 16 and 32 bits); as noted above, in one embodiment, the precision/format employed by the floating point multiplier and/or the floating point accumulator may depend upon the memory bandwidth available/allocated, wiring bandwidth available/allocated, and/or the amount of area available/allocated to the floating point circuitry of the processing circuitry to store, transfer/read and/or process data (e.g., data partially processed and to be processed) within, for example, an integrated circuit; notably, the present inventions may be implemented via floating point execution circuitry that maybe configured with the same precision width or different precision widths/formats;

FIG. 2C illustrates a schematic block diagram of an exemplary logical overview of an exemplary multiplier-accumulator execution or processing pipeline (see FIGS. 1A and 2B) wherein each multiplier-accumulator circuit includes a multiplier circuitry performing operation in a floating point format and/or accumulator circuitry performing operations in a floating point format (e.g., the same floating point format as multiplier circuitry), according to one embodiment of the present inventions; in this exemplary embodiment, the multiplier-accumulator circuit may include a plurality of memory banks (e.g., SRAM memory banks) that are dedicated to the multiplier-accumulator circuit to store filter weights used by the multiplier circuitry of the associated multiplier-accumulator circuit; in one illustrative embodiment, the MAC execution or processing pipeline includes 64 multiplier-accumulator circuits (see FIG. 1A); notably, in the logical overview of a linear pipeline configuration of this exemplary multiplier-accumulator execution or processing pipeline, a plurality of processing (MAC) circuits ("n") are connected in the execution pipeline and operate concurrently; for example, in one exemplary embodiment where n=64, the multiplier-accumulator processing circuits 64×64 multiply-accumulate operations in each 64 cycle interval (here, a cycle may be, e.g., nominally 1 ns); thereafter, next 64 input pixels/data are shifted-in and the previous output pixels/data are shifted-out during the same 64 cycle intervals; each 64 cycle interval processes a Dd/Yd (depth) column of input and output pixels/data at a particular (i,j) location (the indexes for the width Dw/Yw and height Dh/Yh dimensions); the 64 cycle execution interval is repeated for each of the Dw*Dh depth columns for this stage; notably, in one embodiment, each multiplier-accumulator circuit may include two dedicated memory banks to store at least two different sets of filter weights—each set of filter weights associated with and used in processing a set of data) wherein each memory bank may be alternately read for use in processing a given set of associated data and alternately written after processing the given set of associated data; the filter weights or weight data are loaded into memory (e.g., the L1/L0 SRAM memories) from, for example, an external memory or processor before the stage processing started (see, e.g., the '345 and '306 applications); notably, the multiplier-accumulator circuits and circuitry of the present inventions may be interconnected or implemented in one or more multiplier-accumulator execution or processing pipelines including, for example, execution or processing pipelines as described and/or illustrated in U.S. Provisional Patent Application No. 63/012,111; the '111 application is incorporated by reference herein in its entirety;

FIGS. 3A and 3B illustrate high-level logical overviews of exemplary floating point addition or accumulator circuits, according to a plurality of embodiments of the present inventions, wherein in these illustrative embodiments, the circuitry implements a mantissa (fraction) size is 24 bits (including a hidden/implicit bit of weight 1.0 on the left), the exponent is 8 bits, and the sign is one bit; notably, in one embodiment, the high-level overviews of the floating point accumulation circuitries, and operations implemented thereby, may employ a 32 bit IEEE format—albeit, as discussed above, other floating point formats are available;

FIGS. 4A and 4B illustrate adjustment methods to implement modifications of the precision of a floating point accumulator circuit, according to an embodiment of the present inventions; notably, the Verilog (and other high-level description languages) include the ability to define parameters wherein a parameter is a named constant that is declared in the description code for the module, which contains a static value; here, the parameter may be changed to a new value when the description code is compiled, but it retains the value during execution of the code—which is in contrast to the "reg" and "wire" elements of Verilog which are used to hold the dynamic values of data and control signals (these values will change during execution);

FIGS. 5A and 5B illustrate additional adjustment methods to implement modifications of the precision of a floating point accumulator circuit, according to an embodiment of the present inventions;

FIGS. 6A and 6B illustrate area on the integrated circuit die of exemplary floating point accumulator circuit;

FIGS. 7A and 7B illustrate exemplary logic schematic of left-shift circuitry of accumulator circuitry (e.g., FPADD32 and FPADD24 of the execution or processing circuitry), according to embodiments of the present inventions;

FIGS. 8A and 8B illustrate exemplary Verilog code for left-shift circuitry of FIG. 7A (i.e., FPADD32) and 7B (i.e., FPADD24), respectively, according to embodiments of the present inventions;

FIG. 8C illustrates exemplary Verilog code of control logic that is capable of controlling the left-shift circuitry of, for example, FIGS. 7A/8A (i.e., FPADD32) and 7B/8B (i.e., FPADD24), according to embodiments of the present inventions; in one embodiment, the control logic generates the LS[4:0] control signals for the left-shift circuitry of FIGS. 7A/8A (i.e., FPADD32) and 7B/8B (i.e., FPADD24);

FIG. 9 illustrates a schematic block diagram of circuitry of a first embodiment to implement a priority encode operation/function of the exemplary floating point addition or accumulator circuits, according to certain aspects of the present inventions, wherein in these illustrative embodiments, the operation/function is employed in the event that two operands with different signs and approximately equal values are added—which may produce a sum/result that is no longer normalized because of a cancellation of the upper bits of the mantissa;

FIG. 10A illustrates a schematic block diagram of another embodiment of circuitry to implement a priority encode operation/function of the exemplary floating point addition or accumulator circuits, according to certain aspects of the present inventions, wherein in these illustrative embodiments, the operation/function is employed in the event that two operands with different signs and approximately equal values are summed or added—which may generate or produce a sum/result that is no longer normalized because of a cancellation of the upper bits of the mantissa;

FIG. 10B illustrates a schematic block diagram of seven of these cells are assembled for the priority encode circuit of the FPADD32 circuit of FIG. 10B, according to certain aspects of the present inventions, wherein the IN[0:27] vector is driven from the top, as before (the extra IN[27] signal will have a zero) and the vector of five PENz[7] signals on the right will provide a "11111" input so that the presence of no-ones can be detected; in this exemplary embodiment, the PENz[i] vector is passed between the seven cells, and emerges on the left with the priority encode value PEN[4:0], and the Nz[i], Ny[i], and Nx[i] values are static and are driven into each cell to provide the bit position index information;

FIGS. 10C and 10D illustrate exemplary Verilog code for circuitry to implement a priority encode operation/function of the exemplary floating point addition or accumulator circuitry (e.g., FPADD24 and FPADD32 circuits) of FIGS. 10A and 10B, according to embodiments of the present inventions;

FIG. 11A illustrates a schematic logic diagram of another exemplary floating point addition or accumulator circuit embodiment, according to a plurality of embodiments of the present inventions, wherein in this illustrative embodiment, the circuitry may implement 32 bit floating point format or a 24 bit floating point format;

FIG. 11B illustrates a block diagram of seven cells of exemplary floating point addition or accumulator circuit embodiment of FIG. 11A wherein the At[0:27] and Bt[0:27] vectors is driven from the top, as before; and the global carry in CCIN[27] signal is inserted on the right into the CIN[i] input of four-bit cell [6]; in addition, the COUT[i+1]/CIN[i] vector is passed between the seven cells, with i={5,4,3,2,1, 0}, and emerges on the left as CCOUT[0] from COUT[i] output of four-bit cell [0]; and the sum values St[0:27] are driven to the bottom of the block diagram;

FIGS. 11C and 11D illustrate exemplary Verilog code for circuitry to implement the exemplary floating point addition or accumulator (FPADD24 and FPADD32) circuits of FIGS. 11A and 11B, according to embodiments of the present inventions; notably, a significant difference between the embodiments of FIG. 11C and FIG. 11D is parameter values of "w26"/"w27"/"p6"/"p7"—these are 26/27/6/7 for FPADD32 and 18/19/4/5 for FPADD24;

FIG. 12 illustrates exemplary logic schematic of right-shift circuitry of accumulator circuitry (e.g., of FPADD32 and FPADD24 of the execution or processing circuitry), according to embodiments of the present inventions;

FIGS. 13A and 13B illustrate exemplary Verilog code for right-shift circuitry of FIG. 12 for FPADD32 format and FPADD24 format, respectively, according to embodiments of the present inventions; and FIG. 13C illustrates exemplary Verilog code of control logic that is capable of controlling right-shift circuitry of the accumulator circuitry (e.g., FIGS. 12/13A (i.e., FPADD32) and 12/13B (i.e., FPADD24)), according to embodiments of the present inventions; in one embodiment, the control logic generates the LS[4:0] control signals for the right-shift circuitry illustrated in FIGS. 12/13A (i.e., FPADD32) and 12/13B (i.e., FPADD24); wherein the "RSa[4:0]" is the name of the "RS[4:0]" signals in the control logic; in the embodiment of the FPADD32 circuit/embodiment, the RSa [4:0] signals are driven directly from the EU[4:0], EV[4:0], and EAgeEB signals from the exponent compare unit; in the embodiment of the FPADD24 circuit/embodiment, the RSa [4:0] signals are generated from the EU[4:0], EV[4:0], and EAgeEB signals from the exponent compare unit, but with some logical manipulation (the EU015, EV015, EU1617, and EV1617 signals) to account for the modified RS[4] stage.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed or illustrated separately herein.

DETAILED DESCRIPTION

In one aspect, the present inventions are directed to one or more integrated circuits having multiplier-accumulator circuitry (and methods of operating such circuitry) for data processing (e.g., image filtering) wherein the multiplier circuitry performs multiplication operations and/or the accumulator circuitry perform accumulation operations using floating point data and/or based on a floating point data format. The floating point data format of the multiplier circuitry is the same as the floating point data format of the accumulator circuitry (e.g., such as 16, 24 and 32 bits). In another embodiment, the floating point data format of the multiplier circuitry is different from the floating point data format of the accumulator circuitry. For example, the multiplier circuitry may include a 16 bit floating point multiplier and the accumulator circuitry may include a 24 or 32 bit floating point adder or accumulator.

The multiplier-accumulator circuitry may be implemented in an execution or processing pipeline including execution circuitry (i.e., multiplier-accumulator circuits) employing one or more floating point data formats. Here, the multiplier circuitry may be a floating point multiplier and/or the accumulator circuitry may be a floating point accumulator. In one embodiment, the execution or processing pipeline includes a plurality of multiplier-accumulator circuits, each circuit including a floating point multiplier and/or a floating point accumulator. For example, the plurality of multiplier-accumulator circuits (each having floating point processing circuitry) may be interconnected (in series) to perform the multiply and accumulate operations and/or the pipelining architecture or configuration implemented via connection of multiplier-accumulator circuits. In this pipeline architecture, for example, the plurality of multiplier-accumulator circuits may concatenate the multiply and accumulate operations of the data processing.

The floating point data formats may be user or system defined and/or may be one-time programmable (e.g., at manufacture) or more than one-time programmable (e.g., (i) at or via power-up, start-up or performance/completion of the initialization sequence/process sequence, and/or (ii) in situ or during normal operation). In one embodiment, the execution circuitry (e.g., the multipliers and/or the accumulators) of the data processing pipelines includes adjustable/programmable floating point precision—which is one-time programmable (e.g., at manufacture) or more than one-time programmable.

In one embodiment, the present inventions are implemented in one or more execution or processing pipelines (e.g., for image filtering) having multiplier-accumulator circuitry—for example, circuitry disposed on an integrated circuit. With reference to FIG. 1A, in one embodiment the multiplier-accumulator circuitry is implemented in an execution pipeline that is configured in a linearly connected pipeline architecture. In this configuration/architecture, Dijk data is fixed in place during execution and Yijl data that rotates during execution. The 64×64 Fkl filter weights are distributed across L0 memory (in this illustrative embodiment, 64 L0 SRAMs—one L0 SRAM in each MAC processing circuit of the 64 MAC processing circuit of the pipeline). In each execution cycle, 64 Fkl values will be read and passed to the MAC elements or circuits. The Dijk data values are stored or held in one processing element during the 64 execution cycles after being loaded from the Dijk shifting chain—which is connected to DMEM memory (here, L2 memory—such as SRAM).

Further, during processing, the Yijlk MAC values are rotated through all 64 processing elements during the 64 execution cycles after being loaded from the Yijk shifting chain (see $Y_{MEM}$ memory), and will be unloaded with the same shifting chain.

Further, in this exemplary embodiment, "r" (e.g., 64 in the illustrative embodiment) MAC processing circuits in the execution pipeline operate concurrently whereby the multiplier-accumulator processing circuits perform r×r (e.g., 64×64) multiply-accumulate operations in each r (e.g., 64) cycle interval (here, a cycle may be nominally 1 ns). Thereafter, a next set of input pixels/data (e.g., 64) is shifted-in and the previous output pixels/data is shifted-out during the same r (e.g., 64) cycle interval. Notably, each r (e.g., 64) cycle interval processes a Dd/Yd (depth) column of input and output pixels/data at a particular (i,j) location (the indexes for the width Dw/Yw and height Dh/Yh dimensions). The r (e.g., 64) cycle execution interval is repeated for each of the Dw*Dh depth columns for this stage. In this exemplary embodiment, the filter weights or weight data are loaded into memory (e.g., the L1/L0 SRAM memories) from, for example, an external memory or processor before the stage processing started (see, e.g., the '345 and '306 applications). In this particular embodiment, the input stage has Dw=512, Dh=256, and Dd=128, and the output stage has Yw=512, Yh=256, and Yd=64. Note that only 64 of the 128 Dd input are processed in each 64×64 MAC execution operation.

With continued reference to FIG. 1A, the method implemented by the configuration/architecture illustrated may accommodate arbitrary image/data plane dimensions (Dw/Yw and Dh/Yh) by adjusting the number of iterations of the basic 64×64 MAC accumulation operation that are performed. The loop indices "I" and "j" are adjusted by control and sequencing logic circuitry to implement the dimensions of the image/data plane. Moreover, the method may also be adjusted and/or extended to handle a Yd column depth larger than the number of MAC processing elements (e.g., 64 in this illustrative example) in the execution pipeline. In one embodiment, this may be implemented by dividing the depth column of output pixels into blocks (e.g., 64), and repeating the MAC accumulation of FIG. 1A for each of these blocks.

Indeed, the method illustrated in FIG. 1A may be further extended to handle a Dd column depth larger than the number of MAC processing elements/circuits (64 in this illustrative example) in the execution pipeline. This may be implemented, in one embodiment, by initially performing a partial accumulation of a first block of 64 data of the input pixels Dijk into each output pixel Yijl. Thereafter, the partial accumulation values Yijl are read (from the memory $Y_{mem}$) back into the execution pipeline as initial values for a continuing accumulation of the next block of 64 input pixels Dijk into each output pixel Yijl. The memory which stores or holds the continuing accumulation values (e.g., L2 memory) may be organized, partitioned and/or sized to accommodate any extra read/write bandwidth to support the processing operation.

Notably, these techniques, which generalize the applicability of the 64×64 MAC execution pipeline, may also be utilized or extend to the generality of the additional methods that will be described in later sections of this application. Indeed, this application describes an inventive method or technique to design a floating point execution unit/circuit in a standard description language (e.g., Verilog language). The design may be scalable through a wide range of precisions (a 6:1 ratio). In this way, the area/cost of the execution unit/circuit may be minimized and/or reduced for the numeric accuracy requirements. In one embodiment, the scaling may be implemented in a way that is compatible with the back-end logic synthesis and place/route software tool suite.

With reference to FIG. 1B, the floating point execution circuitry (e.g., the multiplier circuitry and/or accumulator circuitry) may be configured with the same or different precision widths (floating point formats). In one embodiment, the floating point data format is the same—here, the precision width of the multiplier and accumulator circuitry of the execution circuitry is the same (e.g., 16 bit, 24 bit, 28 bit or 32 bit). In another embodiment, the floating point data format of the multiplier circuitry is different from the floating point data format of the accumulator circuitry. For example, the multiplier circuitry may include a 16 bit floating point multiplier and the accumulator circuitry may include a 24 or 32 bit floating point adder or accumulator. Notably, the precision width employed may depend upon the memory bandwidth and wiring bandwidth that is available for storing and transferring data within the system or circuitry of, for example, an integrated circuit.

FIG. 1C illustrates exemplary floating point format that may be employed in connection with at least certain aspects of the present inventions. The configuration method allows precisions in the range of FP14 through FP39—here the "xx" label of the floating point (i.e., FPxx where: xx is an integer and is greater than or equal to 14 and less than or equal to 39 (i.e., 14≤xx≤39)) indicates the total number of bits (sign, exponent, mantissa/fraction) used for storing and transporting data of the floating point format. Note that a normalized mantissa/fraction field has an additional implicit/hidden bit with a weight of 1.0.

For the purposes of illustration, a 24 bit floating point format (FP24) and a 32 bit floating point format (FP32) formats are employed to describe certain circuitry and/or methods of certain aspects of certain features of the present inventions. Moreover, such FP24 and FP32 formats are often described herein in the context of the addition operation. The inventions, however, are not limited to (i) particular floating point format(s), operations (e.g., addition, subtraction, etc.), block/data width, data path width, bandwidths, values, processes and/or algorithms illustrated, nor (ii) the exemplary logical or physical overview configurations, exemplary module/circuitry configuration and/or exemplary Verilog code.

As mentioned above, the present inventions may be implemented in multiplier-accumulator circuits of one or more multi-bit MAC execution pipelines, wherein the multiplier-accumulator circuits include floating point data processing circuitry (e.g., multiplier circuitry and/or accumulator circuitry that process data in a floating point data format). In one embodiment, the execution or processing pipeline includes a plurality of multiplier-accumulator circuits, each circuit including a floating point multiplier and/or a floating point accumulator. For example, the plurality of multiplier-accumulator circuits (each having floating point processing circuitry) may be interconnected (in series) to perform the multiply and accumulate operations and/or the pipelining architecture or configuration implemented via connection of multiplier-accumulator circuits. In this pipeline architecture, for example, the plurality of multiplier-accumulator circuits may concatenate the multiply and accumulate operations of the data processing.

In one embodiment, the multiplier-accumulator circuits (employing floating point multiplier circuitry and/or floating point accumulator circuitry) are interconnected into execution or processing pipelines as described and/or illustrated in the '111 application. In one embodiment, the circuitry configures and controls a plurality of separate multiplier-accumulator circuits (which may be referred to, at times, as "MAC" or "MAC circuits") or rows/banks of interconnected (in series) multiplier-accumulator circuits (referred to, at times, as clusters) to pipeline multiply and accumulate operations. In one embodiment, the plurality of multiplier-accumulator circuits (e.g., having the floating point multiplier and accumulator circuitry described above) may include a plurality of registers (including a plurality of shadow registers) wherein the circuitry also controls such registers to implement or facilitate the pipelining of the multiply and accumulate operations performed by the multiplier-accumulator circuits to increase throughput of the multiplier-accumulator execution or processing pipelines in connection with processing the related data (e.g., image data). (See, e.g., '345 and '306 applications).

In another embodiment, the interconnection of the pipeline or pipelines, (each including a plurality of MAC circuits implementing the floating point accumulator circuitry and/or the floating point multiplier circuitry of the present inventions) are configurable or programmable to provide different forms of pipelining. (See, e.g., the '111 application). Here, the pipelining architecture provided by the interconnection of the plurality of multiplier-accumulator circuits (e.g., having the floating point multiplier and accumulator circuitry) may be controllable or programmable. In this way, a plurality of multiplier-accumulator circuits may be configured and/or re-configured to form or provide the desired processing pipeline(s) to process data (e.g., image data).

For example, with reference to the '111 application, in one embodiment, control/configure circuitry may configure or determine the multiplier-accumulator circuits having floating point processing circuitry, or rows/banks of interconnected multiplier-accumulator circuits having floating point processing circuitry are interconnected (in series) to perform the multiply and accumulate operations and/or the pipelining architecture or configuration implemented via connection of multiplier-accumulator circuits (or rows/banks of interconnected multiplier-accumulator circuits). Thus, in one embodiment, the control/configure circuitry configures or implements an architecture of the execution or processing pipeline by controlling or providing connection(s) between multiplier-accumulator circuits and/or rows of interconnected multiplier-accumulator circuits—each of which include one or more floating point multiplier circuitry embodiments and/or one or more floating point accumulator circuitry embodiments described herein.

With reference to FIG. 1D, as noted above, in one embodiment, one or more multi-bit MAC execution pipelines, including floating point data processing circuitry (e.g., multiplier circuitry and/or accumulator circuitry that processes data in a floating point data format) may be organized as clusters of a component—for example, as described and/or illustrated in the '164 and '413 applications. The processing elements of the execution pipeline may operate at the one MAC per ns processing rate when configured in and employing fixed point (integer) data formats. Where the processing elements of the execution pipeline are configured in and employing a floating point format, the processing in connection with such floating point data formats may be at a lower rate because of an increase in the data format size. Because of the large number of MAC circuits/units that are implemented (typically thousands to tens of thousands), it is advantageous that the size of the floating point execution circuits/units be configured properly.

Briefly, with continued reference to FIG. 1D, the integrated circuit may include a plurality of multi-bit MAC execution pipelines, each pipeline including a plurality of multiplier-accumulator circuits, connected in series, which are organized as one or more clusters of a processing component. Here, the component may include "resources" such as a bus interfaces (e.g., a PHY and/or GPIO) to facilitate communication with circuitry external to the component and memory (e.g., SRAM and DRAM) for storage and use by the circuitry of the component. For example, in one embodiment, four clusters are included in the component (labeled "X1") wherein each cluster includes a plurality of multi-bit MAC execution pipelines (in this illustrative embodiment 16 64-MAC execution pipelines). Notably, one MAC execution pipeline (which in this illustrative embodiment includes 64 MAC processing circuits) of FIG. 1A is illustrated at the lower right for reference purposes.

With continued reference to FIG. 1D, the memory hierarchy in this exemplary embodiment includes an L0 memory (e.g., SRAM) that stored filter weights or coefficients to be employed by multiplier-accumulator circuits in connection with the multiplication operations implemented thereby. In one embodiment, each MAC execution pipeline includes an L0 memory to store the filter weights or coefficients associated with the data under processing by the circuitry of the MAC execution pipeline. An L1 memory (a larger SRAM resource) is associated with each cluster of MAC execution pipelines.

These two memories may store, retain and/or hold the filter weight values Fijklm employed in the accumulation operations.

Notably, the embodiment of FIG. 1D may employ an L2 memory (e.g., an SRAM memory that is larger than the SRAM of L1 or L0 memory). A network-on-chip (NOC) couples the L2 memory to the PHY (physical interface) to provide connection to an external memory (e.g., L3 memory—such as, external DRAM component(s)). The NOC also couples to a PCIe PHY which, in turn, couples to an external host. The NOC also couples to GPIO input/output PHYs, which allow multiple X1 components to be operated concurrently. The control/configure circuit (referred to, at times, as "NLINK" or "NLINK circuit") connect to multiplier-accumulator circuitry (which includes a plurality (here, 64) multiplier-accumulator circuits or MAC processors) to, among other things, configure the overall execution pipeline by providing or "steering" data between one or more MAC pipeline(s), via programmable or configurable interconnect paths. In addition, the control/configure circuit may configure the interconnection between the multiplier-accumulator circuitry and one or more memories—including external memories (e.g., L3 memory, such as external DRAM)—that may be shared by one or more (or all) of the clusters of MAC execution pipelines. These memories may store, for example, the input image pixels Dijk, output image pixels Yijl (i.e., image data processed via the circuitry of the MAC pipeline(s), as well as filter weight values Fijklm employed in connection with such data processing.

Notably, although the illustrative or exemplary embodiments described and/or illustrated a plurality of different memories (e.g., L3 memory, L2 memory, L1 memory, L0 memory) which are assigned, allocated and/or used to store certain data and/or in certain organizations, one or more of other memories may be added, and/or one or more memories may be omitted and/or combined/consolidated—for example, the L3 memory or L2 memory, and/or the organizations may be changed. All combinations are intended to fall within the scope of the present inventions.

Moreover, in the illustrative embodiments set forth herein (text and drawings), the multiplier-accumulator circuitry and/or multiplier-accumulator pipeline is, at times, labeled "NMAX", "NMAX pipeline", "MAC", or "MAC pipeline".

With continued reference to FIG. 1D, the integrated circuit(s) include a plurality of clusters (e.g., two, four or eight) wherein each cluster includes a plurality of multiplier-accumulator circuit ("MAC") execution pipelines (e.g., 16). Each MAC execution pipeline may include a plurality of separate multiplier-accumulator circuits (e.g., 64) to implement multiply and accumulate operations. In one embodiment, a plurality of clusters are interconnected to form a processing component (such component is often identified in the figures as "X1" or "X1 component") that may include memory (e.g., SRAM, MRAM and/or Flash), a switch interconnect network to interconnect circuitry of the component (e.g., the multiplier-accumulator circuits and/or MAC execution pipeline(s) of the X1 component) and/or circuitry of the component with circuitry of one or more other X1 components. Here, the multiplier-accumulator circuits of the one or more MAC execution pipelines of a plurality of clusters of a X1 component may be configured to concurrently process related data (e.g., image data). That is, the plurality of separate multiplier-accumulator circuits of a plurality of MAC execution pipelines may concurrently process related data to, for example, increase the data throughput of the X1 component.

Notably, the X1 component may also include interface circuitry (e.g., PHY and/or GPIO circuitry) to interface with, for example, external memory (e.g., DRAM, MRAM, SRAM and/or Flash memory).

In one embodiment, the MAC execution pipeline may be any size or length (e.g., 16, 32, 64, 96 or 128 multiplier-accumulator circuits). Indeed, the size or length of the pipeline may be configurable or programmable (e.g., one-time or multiple times—such as, in situ (i.e., during operation of the integrated circuit) and/or at or during power-up, start-up, initialization, re-initialization, configuration, re-configuration or the like).

In another embodiment, the one or more integrated circuits include a plurality of components or X1 components (e.g., 2, 4, . . . ), wherein each component includes a plurality of the clusters having a plurality of MAC execution pipelines. For example, in one embodiment, one integrated circuit includes a plurality of components or X1 components (e.g., 4 clusters) wherein each cluster includes a plurality of execution or processing pipelines (e.g., 16, 32 or 64) which may be configured or programmed to process, function and/or operate concurrently to process related data (e.g., image data) concurrently. In this way, the related data is processed by each of the execution pipelines of a plurality of the clusters concurrently to, for example, decrease the processing time of the related data and/or increase data throughput of the X1 components.

As discussed in the '164 and '413 applications, both of which are incorporated by reference herein in their entirety, a plurality of execution or processing pipelines of one or more clusters of a plurality of the X1 components may be interconnected to process data (e.g., image data) In one embodiment, such execution or processing pipelines may be interconnected in a ring configuration or architecture to concurrently process related data. Here, a plurality of MAC execution pipelines (each including a plurality of MAC circuits implementing the floating point accumulator circuitry and/or the floating point multiplier circuitry of the present inventions) of one or more (or all) of the clusters of a plurality of X1 components (which may be integrated/manufactured on a single die or multiple dice) may be interconnected in a ring configuration or architecture (wherein a bus interconnects the components) to concurrently process related data. For example, a plurality of MAC execution pipelines of one or more (or all) of the clusters of each X1 component are configured to process one or more stages of an image frame such that circuitry of each X1 component processes one or more stages of each image frame of a plurality of image frames. In another embodiment, a plurality of MAC execution pipelines of one or more (or all) of the clusters of each X1 component are configured to process one or more portions of each stage of each image frame such that circuitry of each X1 component is configured to process a portion of each stage of each image frame of a plurality of image frames. In yet another embodiment, a plurality of MAC execution pipelines of one or more (or all) of the clusters of each X1 component are configured to process all of the stages of at least one entire image frame such that circuitry of each X1 component is configured to process all of the stage of at least one image frame. Here, each X1 component is configured to process all of the stages of one or more image frames such that the circuitry of each X1 component processes a different image frame.

With reference to FIGS. 2A-2C, the data processing circuitry of an exemplary illustrative embodiment includes one or more multiplier-accumulator circuits—each multiplier-accumulator circuit including a multiplier circuitry ("MUL") to perform operation in a floating point format and/or accumulator circuitry ("ADD") to perform operations in a floating point format (e.g., the same floating point format as multiplier circuitry). In one embodiment, the multiplier-accumulator circuit may include two dedicated memory banks to store at least two different sets of filter weights—each set of filter weights associated with and used in processing a set of data) wherein each memory bank may be alternately read for use in processing a given set of associated data and alternately written after processing the given set of associated data.

In one embodiment, input data (e.g., image pixel values) are accessed in or read from memory (e.g., an L2 memory). (See, e.g., FIG. 2B). The input data may or may not be in a floating point format (e.g., 16 bit) that is correlated to or consistent with the format employed by the illustrative MAC processing circuitry (here, multiplier circuitry thereof). If not, the circuitry may convert the data format of the input data to the appropriate format (e.g., FP16). For example, if the input data (e.g., image data) have been generated by an earlier filtering operation and/or stored in memory (e.g., SRAM such as L2 memory) after generation/acquisition, such data may be in a 24 bit floating point format (FP24—24 bits for sign, exponent, fraction). Under this circumstance, in one embodiment, the data/pixels may be converted (e.g., on-the-fly—i.e., immediately prior to such data processing) into an FP16 format, which may be the format employed by the multiplier circuitry in connection with the multiplication operation.

With continued reference to FIGS. 2A-2C, the input data are shifted into the multiplier-accumulator circuit via loading register "D_SI". In one embodiment, such data is thereafter parallel-loaded into the data register "D". The data are then input into the multiplier circuitry (identified as "MUL" in FIGS. 2A and 2C, and "FP24 MUL" in FIG. 2B (that is, in the example, a FP24 multiplier) to perform, in a floating point format, the multiplication operation of the input data with the filter weight.

The input filter weight, in one exemplary embodiment, are accessed in or read from L0 memory. In one embodiment, the filter weights may be previously loaded from L2 memory to L1 memory, and then from L1 memory to L0 memory. (See FIG. 2B). In one embodiment, the filter weights are stored in L2 memory in an FP8 format (8 bits for sign, exponent, fraction). The filter weight values, in this embodiment, are read from memory (L2—SRAM memory), converted on-the-fly into an FP16 data format, for storage in the L1 and L0 memory levels. Thereafter, the filter weights are loaded into the filter weight register "F" and available/accessible to the multiplier circuitry of the execution circuitry/process of the data processing circuitry.

Alternatively, in one embodiment, the filter weights are stored in memory (e.g., L2 memory) in an FP16 format (16 bits for sign, exponent, fraction). The filter weight values, in this embodiment, are read from memory (L2—SRAM memory) and directly stored in the L1 and L0 memory levels (i.e., without conversion). Thereafter, the filter weights are loaded into the filter weight register "F" and are available/accessible to the multiplier circuitry to implement the multiplication operation of the execution circuitry/process of the data processing circuitry. In yet another embodiment, the filter weight values are read from memory (e.g., L2 or L1—SRAM memory) and directly loaded into the filter weight register "F" for use by the multiplier circuitry of the execution circuitry/process of the data processing circuitry.

Note that other numerical precisions and/or data formats may be made for the various values which are to be processed—the values that are shown in this exemplary embodiment represent the precision (e.g., minimum precision) that is practical for a floating point format.

With continued reference to FIGS. 2A-2C, the multiplier circuitry reads the "D" and "F" values and performs a multiplication operation (i.e., multiplies the input data and the filter weight). The product or output of the multiplier circuitry is output to the accumulation stage via the "D*F" register. In one exemplary embodiment, the output data of the multiplier circuitry is in FP24 format and is thereafter accumulated (with FP24 precision) via the accumulator circuitry (identified as "ADD" in FIGS. 2A and 2C, and as "FP24 ADD" in FIG. 2B) and stored in the "Y" register.

In one embodiment, a plurality of outputs of the accumulator circuitry may be accumulated. That is, after each result "Y" has accumulated a plurality of products, the accumulation totals may be parallel-loaded into the "MAC-SO" registers. Thereafter, the accumulation data may be serially shifted out (i.e., output) during a subsequent or the next execution sequence (e.g., to memory).

Notably, with reference to FIG. 2C, the plurality of multiplier-accumulator circuits of the execution or processing pipeline are connected in series and form a ring configuration or architecture. Here, each MAC circuit, implementing the floating point accumulator circuitry and/or the floating point multiplier circuitry of the present inventions, is connected to two other MAC circuits of the plurality of MAC circuits that are interconnected in the ring configuration/architecture. For example, in one embodiment of the ring configuration/architecture, the output of the accumulator of a first MAC circuit (e.g., MAC 1) is input into the accumulator of a second MAC circuit (e.g., MAC 2) and the output of a third MAC circuit (e.g., MAC n) is input into the accumulator of the first MAC circuit (e.g., MAC 1).

FIG. 3A illustrates a logical overview of an exemplary embodiment of 32 bit floating point addition (FPADD32) operation of an accumulation circuit according to certain aspects of the present inventions (as noted above, "FP32" portion of the acronym signifies a 32 bit floating point format and "ADD" signifies an addition operation of the floating point architecture, module or circuitry). Notably, the exemplary embodiment may be employed in connection with a 32 bit IEEE format, wherein the mantissa (fraction) size is 24 bits (including a hidden/implicit bit of weight 1.0 on the left), the exponent is 8 bits, and the sign is one bit. The logic implementation illustrated here is similar to the implementation of other floating point formats (e.g., FP24).

With reference to FIGS. 3A and 3B, the flow is from top to bottom wherein two operands (A and B) are received in the register cells (see top of FIG. 3A), and a 32 bit result (D) is produced (see bottom of FIG. 3A). Typically, the result would be received by a pipeline register (as shown), so that one pipeline cycle would be available for the floating point addition operation. In one embodiment, additional pipeline registers may be employed and disposed within the logic, so that more pipeline cycles (e.g., two pipeline cycles or four pipeline cycles) are available for the floating point addition operation—thereby increasing the throughput rate (at the expense of the latency as measured in pipeline cycles).

With reference to FIGS. 3A and 3B, the processing flow in the floating point addition of these exemplary embodiments include:

[1] comparing the two exponents, and optionally swapping the two operands,

[2] right-shift (align) the mantissa of the operand with the smaller exponent,

[3] add (or subtract) the two mantissas,

[4] normalize sum of the mantissas with priority-encode and left-shift and exponent adjust,

[5] round the normalized mantissa and exponent adjust, and

[6] generate constants for exponent and mantissa for special cases.

These processing operations/steps may be performed or implemented, in one embodiment, using an assortment of logical elements (e.g., disposed on one or more integrated circuits). For example, a 2-to-1 multiplexer is the one of logical element which selects one of two inputs as a function of a third control input. The second element may be logic circuits or gates (e.g., basic logic circuits or gates such as, for example, AND, OR, and/or XOR) which are typically used to implement the control logic. The third element is the shifting structures/circuits—which may be constructed from multiplexers, but also include large amounts of wiring for transporting bits horizontally. The fourth element is add/subtract blocks. This category also includes increment and decrement blocks—basically any block with horizontal carry propagation. The fifth element is the priority encoder block. Moreover, the shift structures/circuit and priority encoder structures/circuit also transmits/transports control information horizontally.

Note that although the operands and result have a 24 bit width, the internal mantissa paths are 27 bit wide. This is intended to provide guard bits for rounding. As a result, data on the right hand edge of the mantissa path at a number of bit positions must be extracted and used by the control logic. If it is necessary to support more than one precision size (e.g. the FPADD32 and FPADD24 examples are illustrative in this analysis), it may be useful to modify certain sections of the description language (e.g., Verilog code) which control, dictate or drive the synthesis and place/route tools.

In one aspects, the present inventions, in one embodiment, are directed to generating a single version of Verilog description of the floating point module/circuitry. The Verilog description may be employed (with the synthesis and place/route tools) to generate a floating point addition FPADDxx design with a precision that can be selected from a continuous range (e.g., an extensive continuous range). In the examples described and illustrated, the FPxx range is from FP14 to FP39, corresponding to mantissa precision of 6 bits to 31 bits (a 5× range), or a precision of 5 bits to 30 bits if the hidden bit is discounted (a 6× range).

Notably, in one embodiment, a floating point subtraction operation (FPSUB) may be implemented using circuitry corresponding to the logic overview of FIGS. 3A and 3B by inverting the sign bit SA/SB of the A/B operands. This allows the results {A+B, A-B, B-A, -A-B} to be readily generated by adjusting the SA/SB bits.

In one embodiment, the accumulation circuit may include one or more pipeline registers to facilitate implementation in connection with a plurality of execution paths. (See, FIG. 3B). The location of the additional pipeline registers in the logical overview are indicated in dotted boxes.

With reference to FIGS. 4A and 4B, in one embodiment, parameters to adjust precision of a FPADD embodiment are illustrated. Here, FIG. 4A illustrates an implementation of a first adjustment method in connection with the addition or accumulation operation. Verilog (and/or other high-level description languages) include the ability to define parameters. A parameter is a named constant that is declared in the description code for the module/circuit, and which contains a static value. The parameter may be changed to a new value when the description code is compiled, but it will retain the value during execution of the code. This is in contrast to the "reg" and "wire" elements of Verilog which are used to hold the dynamic values of data and control signals—these values will change during execution. Because the parameter values are static constants, they can be used in places that would expect a numeric constant, like the bit-index of a vector of signals.

With continued reference to FIG. 4A, the declaration of a set of parameters of the form wNN, where "NN" is in the range of {27, 26, . . . 10}. The value of these parameters is set by the FPADD32 module. In the table in the second referenced figure, the value of the "w24" module is "24" for FPADD32, for example. The other parameter wNN has the "NN" value of its index for the FPADD32 module/circuit.

The FPADD24 architecture, module and/or operation, on the other hand, has a set of wNN parameters that are, for example, exactly "8" smaller than the FPADD32 parameters. An example of a parameter declaration and the parameter usage for the FPADD24 example is below:

parameter w26=18; //parameter declaration for FPADD24
wire [0:w26] MW=EAgeEB ?MA[0:w26]: MB[0:w26];
//parameter usage This method may be defined for the module sizes of FP14 to FP39. The mantissa width(s) for these sizes are 6 bit to 31 bit (5 bit to 30 bit not counting the hidden/implicit bit). If one column from this parameter table is inserted into the FPADD module, then it may be adjusted for the corresponding size.

An alternative to pasting the column of parameter values into the module is to use an "include" directive. This Verilog command causes a file with Verilog code to be inserted at the position of the include directive in the description code of the module. This would facilitate a new FPADD size to be generated by modifying a single file. Notably, the included code would be identical to the code illustrated in FIG. 4A except it would be included in a different (e.g., and smaller) file.

With reference to FIG. 4B, the additional rows labeled "bypass", "p7", and "p6" are parameter values that adjust the right-shift/left-shift blocks and the priority encode block, respectively. Each "w parameter in the table has a range of 26 values; for example, the w24 value has a range of {6,7, . . . 30,31}. The other parameter ranges are offset from the range of the "w" parameter. Moreover, some of the parameters may have a negative value in certain cases; for example, the w10 value is −1 when the external width parameter w24 is equal to 13. This requires the method of modifying of the RS16/LS16 stages with bypass logic. This method and other features thereof are described in more detail below.

Notably, an alternative to this use of parameters is the use of a "macro" definition. A macro may be defined with a name (label) and a text string value in the description code for the module. When the module is compiled, every instance of the macro name is replaced with the text string value. This provides the same degree of adjustability as the parameter method, and could be used as an alternate method.

With reference to FIGS. 5A and 5B, the control of certain parameters in the exemplary embodiments may be employed to adjust the precision of floating point addition (FPADD) operation/circuit. Here, the two examples illustrate how a first adjustment method/technique may be employed to adjust the precision of the FPADD. With reference to FIG. 5A, the precision of two operands (Mwa[0:w26] and MRSg [0:w26]) are defined or specified. The left hand element will always be bit position "[0]" for all precisions (this is the bit position for the hidden bit with a weight of 1.0). However, the right hand element will be adjusted with the "w26" parameter.

The first example also illustrates how the specification of adjustable constants. The repeat operator can accept a static parameter value, so that an operand of the form "{w27{invMSp}}" creates a vector that is "27" bits wide for the FPADD24 precision, and a scaled width for the other precision alternatives. A constant operand (not shown) would take the form "{w27{1'1}}"—this would specify a vector of 27 logical one values in the case of FPADD32 precision, and a scaled vector width for the other precision alternatives.

Further, the first example (illustrated in FIG. 5A) illustrates a method of performing the addition of two adjustable operands. This method simply used the addition operator of Verilog to specify the scaled operation: "{w27{invMSp}}+{w27{invMSp}}". In this case, the synthesis tool is capable of generating the optimized logic for the addition operation.

Notably, an alternate method for decomposing a variable-width addition into basic logical operations will be illustrated and discussed in detail below. Such techniques may be employed in connection with this aspect of the inventions. For example, this would allow the logic synthesis to be performed from a scalable high-level (Verilog) design that has a uniform low-level of description.

With reference to FIG. 5B, in a second example adjustable parameter values to reference individual bit positions of scalable vectors are employed. In this exemplary embodiment, the individual bit positions are of the form "MS[w23]" and "MS[w24]". As in the previous example, these bit positions may scale to different positions for the different mantissa precision cases.

In the context of area summary for elements of an exemplary FPADD32 embodiment, some applications or implementations that utilize floating point execution pipeline circuitry/hardware may have varying precision requirements. In some applications or implementations, there will be many execution blocks used—and, as such, it may become important to adjust the precision during the silicon design (e.g., at each place in the silicon design) to enhance silicon area, execution power and execution delay. FIGS. 6A and 6B illustrate exemplary evaluations of exemplary floating point addition (FPADD) operation/module/circuit. These figures include tables illustrating benefits of using scalable precisions for the floating point execution blocks—particularly with the area consumed by an FPADD32 block/circuit (FIG. 6A) and the area consumed by an FPADD24 block/circuit (FIG. 6B).

Notably, these aforementioned examples are estimates for CMOS components at a 16 nm process node. The area values are expressed in units of microns-squared (u^2). The tables are separated vertically into the various exponent and mantissa sections, and horizontally into the six basic element types. The left section of the table summarizes the number of each element type in each section, and the right section of the table multiplies the number of elements in each section times an (approximate) area parameter to give area sub-totals.

The exponent sections correspond to the blocks depicted in FIGS. 3A and 3B (exemplary logical overview of FPADD32 embodiment) and include compare, swap, normalize (subtract/increment), and constant generation. The mantissa sections include swap, align, add/sub, normalize, round, and constant generation. The six basic element types include register (only the first pipeline register has been included here), simple gates, 2-to-1 multiplexers, wires, ADD blocks/units/circuits, and PEN blocks/units/circuits. The elements are counted within the full width of the exponent and mantissa sections. It should be noted that the "wire" element is counting the area of the 31/17 horizontal wire tracks used by the FPADD32/FPADD24 units/circuits. With reference to FIGS. 6A and 6B, the total area from the sub-total calculation is shown in the dashed box, and the actual area from the logic synthesis and place/route software is shown in the dash-two dot box. The agreement is within 1% for both the FPADD32 and the FPADD24 exemplary embodiments.

As noted above, although certain of the exemplary embodiments and features of the inventions are illustrated and/or described in the context of floating point addition (FPADD) operation/module/circuit having 24 and 32 bit precision (i.e., FPADD24 and FPADD32), the embodiments and inventions are applicable of other precisions (e.g., FPxx where: xx is an integer and $14 \leq xx \leq 39$). For the sake of brevity, those other precisions will not be illustrated/described separately but will be quite clear to one skilled in the art based on, for example, this application.

Upon inspection of FIGS. 6A and 6B, it can be seen that the scaling from FPADD32 to FPADD24 has reduced the area of the execution unit by a factor of about 0.72x. This results in a significant cost and power savings in those applications in which the 16b mantissa precision of the FPADD24 circuit/unit may be sufficient. Further, the exponent and control logic each account for about 10% of the total area, which may suggest there is less incentive to use scaling in these two sections. In one embodiment, however, application of the parameterization method to the exponent path may be advantageous to observe an additional area savings if a smaller exponent range are employed.

FIGS. 7A and 7B illustrate exemplary logic schematics for a left-shift module/circuit employed in an exemplary floating point addition (FPADD) operation/module/circuit corresponding to FPADD32 and FPADD24 implementations, respectively, in accordance with certain aspects of the present inventions. With reference to FIG. 7A, the exemplary left-shift module/circuitry of a FPADD32 includes five rows of 2-to-1 multiplexers, wherein each row, in operation, performs a shift of zero bit positions or 2^N bit positions, where N={4,3,2,1,0}. In this exemplary embodiment, there are 31 horizontal wire tracks to implement the shifting connections. The shift-in data (on the right) may be zeroes (LO), and the shift-out data (on the left) is not connected (NC). The left-shift module/circuit is 27 bit-positions wide (bit [0] through bit [26]).

With reference to FIG. 7B, the exemplary left-shift module/circuitry of a FPADD24 includes five rows of 2-to-1 multiplexers wherein each row, in operation, performs a shift of zero bit positions or 2^N bit positions, where N={3,2,1,0,1}. There are a total of 17 horizontal wire tracks needed for the shifting connections. As with the exemplary embodiment illustrated in FIG. 7A, the shift-in data (on the right) are zeroes (LO), and the shift-out data (on the left) is not connected (NC). The left-shift module/circuit is 19 bit-positions wide (bit [0] through bit [18]).

Note, a difference in the widths of the two left-shift modules/circuits is 8 bit positions (the difference of the external FP32 and FP24 formats) as well as the five bit control bus LS[4:0] to be generated in the control logic with information from the priority encode unit. Moreover, note that the FPADD24 embodiment does not include as large a shifting range relative to FPADD32 because the FPADD24 embodiment performs shifts in the range of 0 to 17 bit positions. With that in mind, in one embodiment, the shift stage for FPADD32 embodiment that is directed to or handles a 0 or 16 bit position shift may be replaced by a smaller unit that shifts 0 or 2 bit positions (i.e. both the LS[1] and LS[4] rows perform a 0 or 2 bit shift).

With continued reference to FIG. 7B, in this embodiment, the LS[4] row in the FPADD24 embodiment may be implemented/disposed in the bottom of the left-shift module/circuit. In this way, the shift wires of the largest-shift-row are located at the top (LS[3] for FPADD24, LS[4] for FPADD32 thereby providing the wire capacitance to be driven by the previous module/circuit while the LS[4:0] control signals settle (notably, the data is valid on the associated conductors/lines before or earlier than the control is valid on the associated conductors/lines).

With reference to FIG. 7A, the 0 to 31 bit shifting range of the FPADD32 embodiment may be larger than is required given that a 0 to 25 bit shifting range would be suitable/adequate. However, in this exemplary embodiment, the size difference between a 0 or 10 bit shifting stage and a 0 or 16 bit shifting stage is relatively small, and so this optimization was not performed in the FPADD32 unit/circuit—albeit, in one embodiment, such a modification is employed.

FIGS. 8A and 8B illustrate exemplary Verilog code for a left-shift module/circuit employed in an exemplary floating point addition (FPADD) operation/module/circuit corresponding to FPADD32 and FPADD24 implementations, respectively, in accordance with certain aspects of the present inventions. FIG. 8C illustrates exemplary Verilog code for a control circuitry that generates control signals for the left-shift module/circuit employed in an exemplary floating point addition (FPADD) operation/module/circuit corresponding to FPADD32 and FPADD24 implementations, in accordance with certain aspects of the present inventions.

With reference to FIG. 8A, the exemplary Verilog code for a left-shift module/circuitry of a FPADD32 includes, in one exemplary embodiment, input and output data buses having a width defined or specified by the w26 parameter (which, in one embodiment, has a static value of "26" for the FPADD32). The 2-to-1 multiplexing logic use the Verilog conditional operator in a continuous-assignment statement:

assign result [ ]=select ?operand-true [ ]: operand-false [ ].

Moreover, the logical value of the "select" signal determines which of "operand-true" and "operand-false" is applied to or driven onto the "result" signal line or conductor. The "result", "operand-true" and "operand-false" may be vectors. The "select" control signal and, in one embodiment, is a single signal.

Notably, the five rows of multiplexers use the "w26" parameter to specify the width of the operand and result signal vectors.

With reference to FIG. 8B, the exemplary Verilog code for a left-shift module/circuitry of a FPADD24 includes, in one exemplary embodiment, input and output data buses have a width defined or specified by the w26 parameter (which, in one embodiment, has a static value of "18" for the FPADD24). The 2-to-1 multiplexing logic also use the Verilog conditional operator in a continuous-assignment statement.

The five rows of multiplexers also employ the "w26" parameter to specify the width of the operand and result signal vectors in the exemplary FPADD24 implementation. Notably, the LS4_mux row is at the bottom of the left-shift logic, as was discussed with the schematic diagram of the left-shift block for FPADD24 (see, FIG. 7B).

With reference to FIG. 8C, the exemplary Verilog code for control circuitry or logic generates the LS[4:0] control signals for the FPADD24 and FPADD32 left-shift module/circuitry. Notably, the "PENb[4:0]" is the name of the "LS[4:0]" signals in the control logic. In the case of the FPADD32 implementation, the PENb[4:0] signals are driven directly from the PEN[4:0] signals from the priority encode module/circuitry (which is described, in detail, below). In the case of the FPADD24 unit, the PENb[4:0] signals are generated from the PEN[4:0] signals from the priority encode module/circuitry; here, however, there is logical manipulation to account for the modified LS[4] stage.

Notably, in FIG. 8C, the logic for the FPADD24 unit has been "commented out" because this exemplary code is particularly directed to the FPADD32 implementation. The commenting would be switched for the FPADD24 case (not shown for the sake of brevity). As mentioned earlier, this switching may be handled automatically with the use of "include" statements (the desired code would be inserted from an external file). The two alternatives are functionally equivalent.

FIG. 9 illustrates an exemplary logic schematic of a first priority-encode method/circuit employed in an exemplary floating point addition (FPADD) circuit/operation, corresponding to an exemplary FPADD32 circuit implementation, in accordance with certain aspects of the present inventions. The priority-encode function or operation may be significant in the event that two operands with different signs and approximately equal values are added. This can produce a result that is no longer normalized because of the cancellation of the upper bits of the mantissa. This may require that the bit position of the first "1" in the result be detected, and the mantissa shifted left so there is a "1" in bit position [0]. The exponent of the result will also be reduced by the amount of the left shift needed.

With continued reference to FIG. 9, two cell types are present in the priority encode unit/circuit. A "B" cell (see box having a dotted perimeter line) at bit position [i] uses the value IN[i] at that position to dump the bit index [i] onto the Mx[4:0] bus at that position (if IN[i]=1) or to pass the value on the Mx[4:0] bus from the cell on the right (if IN[i]=0). At periodic intervals (every four bit positions in this example) the {IN[i], IN[i+1], IN[i+2], IN[i+3]} values are logically "ORed" into a signal OR4[i] which controls a "look-ahead" mux. An "A" cell (see box having a solid perimeter line) at bit position [i] uses the value OR4[i] at that position to dump the Mx[4:0] bus (from the "B" cell to the right) onto the PEN[4:0] bus (if OR4[i]=1) or to pass the value on the PEN[4:0] bus from the "A" cell on the right (if OR4[i]=0). A "C" cell (see box having a dashed perimeter line) is placed in the control logic to aggregate the signals into a single PEN[4:0] value. This 5 bit value, in this exemplary embodiment, specifies the bit position of the first "1" bit in the IN[0:27] vector (measured from left-to-right starting with bit position [0] on the left).

Notably, in this embodiment, a four-bit-look-ahead structure is employed to mimic the traditional carry-look-ahead structure that is being utilized by the addition block that is producing the IN[0:26] value. As such, the final PEN[4:0] that is produced on the left will settle shortly after the IN[0:26] signals from the addition block settle. A value of "111111" on the PEN[4:0] signals at the left indicate that no "1" was detected on the IN[0:26] vector. This will be true for configurations with 31 or fewer input bits i.e. IN[0:30] or less), the max PEN[4:0] code indicates no ones were found: NoOne<=(PEN[4:0]=31). For the configuration with 32 input bits (i.e. IN[0:31]) the max PEN[4:0] code indicates either (i) no ones were found, or (ii) IN[31] was the only input bit that was a one. This case of no ones "1" is detected by including or adding a gate to the control logic: NoOne<=AND (NOT(IN[31]), (PEN[4:0]=31)).

If a different width of priority encode block is employed (i.e. if an IN[0:18] width is employed for a accumulator circuit implementing an FPADD24 format) then the "A" and "B" cells may be removed from the right hand side (e.g., manually removed). In this way, two different strides may be used for the bit indexes. The "B" cells need bit indexes that change from [i+1] to [i], and the "A" cells need bit indexes that change from [i+4] to [i]. The vector indexes used for the continuous assignment signals may not evaluate an expression the way that the procedural assignment statements evaluate an expression. Instead, an alternate method can be used with static parameter values to create a priority encode module/circuit that will adjust to the required width by changing the parameter value at compile time, as discussed below.

FIG. 10A illustrates an exemplary logic schematic of a second method/circuit priority-encode employed in an exemplary floating point addition operation, module and circuit corresponding to FPADD32 and FPADD24 data format implementations, in accordance with certain aspects of the present inventions. FIG. 10B illustrates an exemplary logic schematic of a second priority-encode method/circuit employed in an exemplary floating point addition operation, module and circuit corresponding to FPADD32 implementation, in accordance with certain aspects of the present inventions. FIGS. 10C and 10D illustrate exemplary Verilog code for a priority-encode of the second method/circuit employed in an exemplary floating point addition operation/module/circuit corresponding to FPADD32 and/or FPADD24 implementations, in accordance with certain aspects of the present inventions. Notably, the priority-encode circuit of this embodiment may be parametrically adjusted or controlled—for example, user or system one-time programmable (e.g., at manufacture) or more than one-time programmable (e.g., (i) at or via power-up, start-up or performance/completion of the initialization sequence/process sequence, and/or (ii) in situ or during normal operation).

With reference to FIG. 10A, the circuit includes the single four-bit cell type that receives four adjacent operand signals {INA[i], INB[i], INC[i], IND[i]}. Each value INa[i] at that position will dump the bit index Nz[i] onto the Ma[4:0] bus at that position (if INa[i]=1) or to pass the value on the Ma[4:0] bus from the cell on the right (if INa[i]=0). Here "a"={A,B,C,D}, and "z"={u,v,x,y,z}, and 'i'={0,1,2,3,4,5,6,7}. Further, the INA[i], INB[i], INC[i], IND[i]} values are logically "ORed" into a signal OR4[i] which controls a "look-ahead" mux. The value OR4[i] at that position dumps the Ma[4:0] bus (from the INA[i] cell to the right) onto the PENz[i] bus (if OR4[i]=1) or to pass the value on the PENz[i+1] bus from the on the right (if OR4[i]=0). The Nu[i] and Nv[i] values are hardwired at each "a"={A,B,C, D} position. Notably, in this embodiment, a 2-to-1 multiplexer gate is implemented as an and-and-or gate—although other implementations may be employed. The and-and-or gate is functionally equivalent to a 2-to-1 multiplexer circuit and, more importantly, can have a select control that is part of a vector.

With reference to FIG. 10B, seven of the cells illustrated in FIG. 10A may be configured or assembled for the priority encode module/circuit of an execution unit of an exemplary FPADD32 circuit. Here, the IN[0:27] vector is driven from the top, as before (the extra IN[27] signal will have a zero). The vector of five PENz[7] signals on the right will provide a "11111" input so that the presence of no-ones can be detected. The PENz[i] vector is passed between the seven cells, and emerges on the left with the priority encode value PEN[4:0]. The Nz[i], Ny[i], and Nx[i] values are static and are driven into each cell to provide the bit position index information.

With reference to FIGS. 10C and 10D, exemplary Verilog code for a priority-encode of the second method/circuit includes a plurality of parameters to implement parametric adjustment or control. For example, in FIG. 10C, the IN[0:w26] input has a variable width, and the Inz[0:31] vector is used to create an INt[0:31] vector with constant width. This is then scattered to the {INA[i], INB[i], INC[i], IND[i]} vectors. In FIG. 10D, for example, three sets of multiplexing and or-ing of the {INA[i], INB[i], INC[i], IND[i]} vectors are handled as vectors of length [0:p6]. The right hand PENz[p7] is set to "11111", and the PENz[0:p6] outputs are evaluated as vectors of length [0:p6]. The final PEN[4:0] output is simply {PENz[0], PENy[0], PENx[0], PENv[0], PENu[0]}. A difference between the exemplary Verilog implementation is the "w26"/"w27"/"p6"/"p7" parameter values—these are 26/27/6/7 for FPADD32 and 18/19/4/5 for FPADD24 (shown in the parameter table that was discussed above).

As noted above, although several of the exemplary embodiments and features of the inventions are illustrated in the context of floating point addition (FPADD) operation/module/circuit having 24 and 32 bit precision (i.e., FPADD24 and FPADD32), the embodiments and inventions are applicable of other precisions (e.g., FPxx where: $14 \leq xx \leq 39$). For the sake of brevity, those precisions will not be illustrated separately but will be quite clear to one skilled in the art based on, for example, this application.

FIG. 11A illustrates an exemplary logic schematic of a method/circuit implementing an addition function/operation in exemplary floating point module/circuit, corresponding to a FPADD32 and/or FPADD24 implementations, in accordance with certain aspects of the present inventions. FIG. 11B illustrates an exemplary logic schematic of an adder module/circuit employed in an exemplary floating point addition operation, module and circuit corresponding to FPADD32 and/or FPADD24 embodiments, in accordance with certain aspects of the present inventions. FIGS. 11C and 11D illustrate exemplary Verilog code for an adder method/circuit employed in an exemplary floating point addition operation/module/circuit corresponding to FPADD32 and FPADD24 embodiments, in accordance with certain aspects of the present inventions. Notably, the adder circuit/method of this embodiment may be parametrically adjusted or controlled—for example, user or system one-time programmable (e.g., at manufacture) or more than one-time programmable (e.g., (i) at or via power-up, start-up or performance/completion of the initialization sequence/process sequence, and/or (ii) in situ or during normal operation). It may be advantageous to implement the circuit/method of FIGS. 11A-11D in a design environment in which the logic synthesis tool may not adjust/optimize the width of an expression of the form "(MWa[0:w26]+MRSg[0:w26])", as was discussed above.

With reference to FIG. 11A, in one embodiment, the adder module/circuit includes a single four-bit cell type that is used (this is similar to the second method/circuit implementing the priority encode operation/function). Here, the module/circuit receives two sets of four adjacent operand signals {Aw[i], Ax[i], Ay[i], Az[i]} and {Bw[i], Bx[i], By[i], Bz[i]}. Each pair of operand signals Aw[i] and Bw[i] are used to generate four sets of intermediate signals Gw[i], Pw[i], and Rw[i]. Here "w"={w,x,y,z}, and "i"={0,1,2,3,4,5,6,7}. Each set of intermediate signals uses a carry-in signal from the right CINw[i], to produce a carry-out signal COUTw[i] that is passed to the left. In addition, each set of intermediate signals also uses CINw[i], to produce a sum-out signal Sw[i] that is passed to the bottom of the cell.

With continued reference to FIG. 11A, a global carry-in signal CIN[i] is also received from the four-bit cell to the right, and becomes the CINz[i] signal for the first set of intermediate signals. The four-bit cell also logically "AND"s the four {Pw[i], Px[i], Py[i], Pz[i]} signals into PP[i]. PP[i] generates the global carry-out COUT[i] for the next cell. If PP[i] is LO, it selects the locally generated carry out COUTw[i], and if PP[i] is HI, it selects the global carry in CIN[i].

With reference to FIG. 11B, seven of the cells illustrated in FIG. 11A may be configured or assembled for the adder module/circuit of an exemplary execution unit/circuit of a FPADD32/FPADD24 circuit embodiment. Here, the At[0:27] and Bt[0:27] vectors is driven from the top, as before. The global carry in CCIN[27] signal is inserted on the right into the CIN[i] input of four-bit cell [6]. The COUT[i+1]/CIN[i] vector is passed between the seven cells, with i={5,4,3,2,1,0}, and emerges on the left as CCOUT[0] from COUT[i] output of four-bit cell [0]. The sum values St[0:27] are output (see the bottom of FIG. 11B).

Notably, in the FPADD32 implementation, the extra At[27] and Bt[27] signals may be LO/L0 because the CCIN[27] is not used (always LO). If an application didn't use the At[27] and Bt[27] signals, but did use CCIN[27](i.e. CCIN[27] may be employed to dynamically insert a carry-in of L0 or HI), then the extra At[27] and Bt[27] signals will be LO/HI to allow the global carry-in to propagate to the first bit position with real data.

With reference to FIGS. 11C and 11D, exemplary Verilog code for a priority-encode of the second method/circuit (i.e., method B) includes a plurality of parameters to implement parametric adjustment or control. These figures illustrate Verilog code that may be employed for the adder module/circuit for the FPADD24 and FPADD32 execution units/circuits. One notable difference between these embodiments is the "w26"/"w27"/"p6"/"p7" parameter values—these are 26/27/6/7 for FPADD32 and 18/19/4/5 for FPADD24 (shown in the parameter table that was discussed earlier).

With reference to FIG. 11C, the A[0:w26] and B[0:w26] inputs have a variable width, and the Ao[0:31] and Bo[0:31] vectors are used to create At[0:31] and Bt[0:31] vectors with constant width. At[0:31] and Bt[0:31] are then scattered to the {Aw[i], Ax[i], Ay[i], Az[i]} and {Bw[i], Bx[i], By[i], Bz[i]} vectors. With reference to FIG. 11D, the {Aw[i], Ax[i], Ay[i], Az[i]} and {Bw[i], Bx[i], By[i], Bz[i]} signals are handled as vectors of length [0:p6], as are the local carry-in signals {CINw[i], CINx[i], CINy[i], CINz[i]}. The intermediate signals {Gw[i], Gx[i], Gy[i], Gz[i]}, {Pw[i], Px[i], Py[i], Pz[i]}, and {Rw[i], Rx[i], Ry[i], Rz[i]} and local carry-out {COUTw[i], COUTx[i], COUTy[i], COUTz [i]} and sum-out {Sw[i], Sx[i], Sy[i], Sz[i]} are produced with the series of vector operations. The global carry-in CIN[0:p6] and global carry-out COUT[0:p6] are also used as vector inputs and outputs to couple the carry information between the four-bit cells. Moreover, the {Sw[i], Sx[i], Sy[i], Sz[i]} are gathered, collected or stored to the St[0:31] vector and then written or returned as the S[0:w26] vector.

As noted above, although several of the exemplary embodiments and features of the inventions are described and/or illustrated in the context of floating point addition operation/module/circuit having 24 and 32 bit precision (i.e., FPADD24 and FPADD32), the embodiments and inventions are applicable of other precisions (e.g., FPxx), including FP20, FP28, FP36 (see, e.g., FIG. 1C). For the sake of brevity, those precisions are not illustrated separately but will be clear to one skilled in the art based on or in view of this application. Moreover, this width-adjusting technique may be extended to addition units/circuits which use more aggressive carry-propagation methods. The four-bit look-ahead method/implementation illustrated here was selected for purposes of clarity. For example, an alternate method may create more than one set of carry propagation logic to further reduce the execution delay. This alternate method may use logic elements like those that have been described.

FIG. 12 illustrates an exemplary logic schematics for a right-shift module/circuit employed in an exemplary floating point addition (FPADD) operation/module/circuit corresponding to FPADD32 implementation, in accordance with certain aspects of the present inventions. With reference to FIG. 12, the exemplary right-shift module/circuitry of FPADD32 circuitry includes five rows of 2-to-1 multiplexers, wherein each row, in operation, performs a shift of zero bit positions or 2^N bit positions, where N={4,3,2,1,0}. In this exemplary embodiment, there are 31 horizontal wire tracks to implement the shifting connections. The shift-in data (on the right) may be zeroes (LO), and the shift-out data (on the left) is not connected (NC). The right-shift module/circuit of the FPADD32 implementation is 27 bit-positions wide (bit [0] through bit [26]).

An exemplary right-shift module/circuitry of FPADD24 circuitry, in one embodiment, is a cut down from the FPADD32 right-shift logic (like that described above in relation to the left-shift circuitry—see FIGS. 7A and 7B, and the text associated therewith). Accordingly, for the sake of brevity, a separate logic schematic for the right-shift logic of the FPADD24 implementation is not provided. The FPADD24 right-shift logic consists of five rows of 2-to-1 multiplexers, wherein each row, in operation, performs a shift of zero bit positions or 2^N bit positions, where N={3,2,1,0,1}. In one embodiment, there are 17 horizontal wire tracks to implement the shifting connections. The shift-in data (on the right) is zeroes (LO), and the shift-out data (on the left) is connected to a chain of "OR" gates to produce a "sticky" signal. The right-shift block of the FPADD24 implementation is 19 bit-positions wide (bit [0] through bit [18]).

Notably, a difference in the widths of the two left-shift blocks is 8 bit positions (the difference of the external FP32 and FP24 formats) and the five bit control bus RS[4:0] is generated in the control logic with information from the exponent compare unit/circuit.

In one embodiment, the shifting range for the FPADD24 circuitry may be smaller than the shifting range of the FPADD32 circuitry because the right-shift logic of the FPADD24 implementation performs shifts in the range of 0 to 17 bit positions. Consequently, in one embodiment, the shift stage of the right-shift logic employed in the FPADD32 implementation that handles a 0 or 16 bit position shift may be replaced by a smaller unit that shifts 0 or 2 bit positions (i.e. both the RS[1] and RS[4] rows perform a 0 or 2 bit shift).

In addition, the RS[4] row of the right-shift logic in the FPADD24 circuitry is moved to the bottom of the right-shift block. This allows the shift wires of the largest-shift-row to be at the top (RS[3] for FPADD24, RS[4] for FPADD32) which thereby allows the wire capacitance thereof to be driven by the previous block while the RS[4:0] control signals settle (note—the data on the data lines is valid before the control on the control lines).

With reference to FIG. 12, the 0 to 31 bit shifting range of the FPADD32 embodiment may be larger than is required given that a 0 to 25 bit shifting range would be suitable/adequate. However, in this exemplary embodiment, the size difference between a 0 or 10 bit shifting stage and a 0 or 16 bit shifting stage is relatively small, and so this optimization was not performed in the FPADD32 unit/circuit—albeit, in one embodiment, such a modification is employed.

FIGS. 13A and 13B illustrate exemplary Verilog code for a right-shift module/circuit employed in an exemplary floating point addition (FPADD) execution operation/module/circuit corresponding to FPADD32 and FPADD24 implementations, respectively, in accordance with certain aspects of the present inventions. FIG. 13C illustrates exemplary Verilog code for a control circuitry that generates control signals for the right-shift module/circuit employed in an exemplary FPADD32 and FPADD24 implementations, in accordance with certain aspects of the present inventions.

With reference to FIG. 13A, the exemplary Verilog code for a right-shift module/circuitry of a FPADD32 includes, in one exemplary embodiment, input and output data buses having a width specified by the w26 parameter (which, in one embodiment, has a static value of "26" for the FPADD32). The 2-to-1 multiplexing logic use the Verilog conditional operator in a continuous-assignment statement:

assign result [ ]=select ?operand-true [ ]: operand-false [ ].

Moreover, the logical value of the "select" signal determines which of "operand-true" and "operand-false" is applied to or driven onto the "result" signal line or conductor. The "result", "operand-true" and "operand-false" may be vectors. The "select" control signal and, in one embodiment, is a single signal.

Notably, the five rows of multiplexers use the "w26", "w25", "w24", "w22", "w18", and "w10" parameters to define or specify the width of the operand and result signal vectors. The sticky logic uses the "w26", "w25", "w23", "w19", and "w11" parameters to define or specify the width of the operand vectors.

With reference to FIG. 13B, the exemplary Verilog code for a right-shift module/circuitry implementing a FPADD24 includes, in one exemplary embodiment, input and output data buses have a width defined or specified by the w26 parameter (which, in one embodiment, has a static value of "18" for the FPADD24—every parameter for the FPADD24 unit is "8" less than the corresponding parameter for the FPADD32 circuit/unit). The 2-to-1 multiplexing logic employ the Verilog conditional operator in a continuous-assignment statement.

The five rows of multiplexers also employ the "w26", "w25", "w24", "w22", "w18", and "w10" parameters to define or specify the width of the operand and result signal vectors. The sticky logic uses the "w26", "w25", "w23", "w19", and "w11" parameters to define or specify the width of the operand vectors. Also note that the LS4_mux row is at the bottom of the right-shift logic, as was previously discussed (see, FIG. 12).

With reference to FIG. 13C, the exemplary Verilog code for control circuitry or logic generates the RS[4:0] control signals for the FPADD24 and FPADD32 right-shift module/circuitry. The "RSa[4:0]" is the name of the "RS[4:0]" signals in the control logic circuitry. In the case of the FPADD32 unit, the RSa[4:0] signals are driven directly from the EU[4:0], EV[4:0], and EAgeEB signals from the exponent compare unit.

With continued reference to FIG. 13C, in the case of the FPADD24 unit/circuit, the RSa[4:0] signals are generated from the EU[4:0], EV[4:0], and EAgeEB signals from the exponent compare unit, but with some logical manipulation (the EU015, EV015, EU1617, and EV1617 signals) to account for the modified RS[4] stage.

In the case of the actual Verilog code for the FPADD32 circuit/unit, the Verilog code for the FPADD24 circuit/unit would be commented out (not shown). The commenting would be switched for the Verilog code for the FPADD24 circuit/unit (also not shown). As mentioned earlier, this switching may be handled automatically with the use of "include" statements (the additional code would be inserted from an external file). The two alternatives are functionally equivalent.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

As noted herein, although several of the exemplary embodiments and features of the inventions are described and/or illustrated in the context of a processing pipeline (including multiplier circuitry) as well as floating point addition (FPADD) operation/module/circuit having 24 and 32 bit precision (i.e., FPADD24 and FPADD32), the embodiments and inventions are applicable in other contexts as well as other precisions (e.g., FPxx where: xx is an integer and is greater than or equal to 14 and less than or equal to 39). For the sake of brevity, those other contexts and precisions will not be illustrated separately but will be quite clear to one skilled in the art based on, for example, this application. For example, such inventive circuitry/processes and data formats (e.g., FP24 and FP32) are often described herein in the context of the addition operation preceded by multiplication operation. The inventions, however, are not limited to (i) particular floating point format(s), operations (e.g., addition, subtraction, etc.), block/data width, data path width, bandwidths, values, processes and/or algorithms illustrated, nor (ii) the exemplary logical or physical overview configurations of the particular circuitry and/or overall pipeline, and/or exemplary module/circuitry configuration, overall pipeline and/or exemplary Verilog code.

In addition, although the conversion circuitry, in the illustrative exemplary embodiments, increases the bit width of the floating point format of the input data and filter weights (see, e.g. FIG. 2B, the conversion circuitry may convert the data from fixed point to floating point and/or decrease the bit width. For example, where the filter weight data is stored in memory in an integer format (INTxx) or a fixed point format (e.g., block-scaled-fraction format ("BSFxx")), the conversion circuitry converts the data to a floating point data format from the integer format or the fixed point format. (See, e.g., the circuitry and techniques described and/or illustrated in U.S. Provisional Patent Application Nos. 62/909,293 and 62/930,601—both of which are incorporated herein by reference). Thus, the conversion circuitry may be employed to convert the size or length of the data, and/or the type of format (e.g., floating point format (FPxx), integer format (INTxx), and fixed point format (e.g., BSFxx)).

The conversion circuitry, in one embodiment, includes an adder circuit (e.g., a floating point adder) to implement or assist in connection with conversion of the data format of the data applied to the conversion circuitry (e.g., filter weight data and/or input data such as image data). The data format (e.g., the precision) of the adder circuit implemented in the conversion circuitry may be the same as to different from the accumulator or adder implemented in the multiplier-accumulator circuits of, for example, the execution pipeline (see, e.g., FIGS. 1A, 1B and 2A-2C). For example, in one embodiment, the accumulator in the MAC circuit include a 24 bit floating point format and the adder in the conversion circuitry may be a 24 or 32 bit floating point adder.

In one embodiment, the conversion circuitry, including the adder, may be disposed in the NLINK or NLINK circuit. (See, e.g., FIG. 1D). Indeed, the '111 application (i.e., U.S. Provisional Patent Application No. 63/012,111) illustrates an adder (here, a 32 bit floating point adder—see FPADD32 in Cell a3 of FIG. 9). As noted above, the '111 application is incorporated by reference herein in its entirety. The inventions described and/or illustrated herein (e.g., the floating point multiplier-accumulator circuits) may be employed in conjunction with the aspects, features and embodiments of the NLINK and NLINK circuits in the '111 application—including the execution or processing pipeline architectures, as discussed above with respect to, for example, FIGS. 1D and 2C. That is, the multiplier-accumulator circuits and circuitry including the floating point formats of the present inventions may be interconnected or implemented in one or more multiplier-accumulator execution or processing pipelines including, for example, execution or processing pipelines described and/or illustrated in the '111 application.

Aspects, features and embodiments of the NLINK and NLINK circuits are discussed in detail in '111 application and, for the sake of brevity, are not set forth again here. Moreover, the NLINK and NLINK circuits are also discussed in detail in the '345 and '306 applications (i.e., U.S. patent application Ser. No. 16/545,345 and U.S. Provisional Patent Application No. 62/725,306)—which, as mentioned above, are also incorporated by reference herein in their entirety. As indicated above, the inventions described and/or illustrated herein may be employed in conjunction with the aspects, features and embodiments of the NLINK and NLINK circuits in the '345 and '306 applications (which is referred to as NLINX therein). For example, the floating point multiplier-accumulator circuits of the present inventions may be employed in connection with the function and layout of the NLINKS (or NLINX) as described and/or illustrated in the '345 and '306 applications.

Notably, the design or architecture of the adder in the conversion circuitry may be the same as or different from the accumulator or adder implemented in the multiplier-accumulator circuits. In one embodiment, both circuits are or include parameterized architectures and may employ parameters and design/configuration techniques outlined or set forth in FIGS. 4A and 4B and the text associated therewith.

As noted above, the present inventions are not limited to (i) particular floating point format(s), particular fixed point format(s), operations (e.g., addition, subtraction, etc.), block/data width or length, data path width, bandwidths, values, processes and/or algorithms illustrated, nor (ii) the exemplary logical or physical overview configurations, exemplary module/circuitry configuration and/or exemplary Verilog code.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

The terms "comprises," "comprising," "includes," "including," "have," and "having" or any other variation thereof, are intended to cover a non-exclusive inclusion, such that a process, method, circuit, article, or apparatus that comprises a list of parts or elements does not include only those parts or elements but may include other parts or elements not expressly listed or inherent to such process, method, article, or apparatus. Further, use of the terms "connect", "connected", "connecting" or "connection" herein should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "a" and "an" herein do not denote a limitation of quantity, but rather denote the presence of at least one of the referenced item. Further, the terms "first," "second," and the like, herein do not denote any order, quantity, or importance, but rather are used to distinguish one element/circuit/feature from another.

In addition, the term "integrated circuit" means, among other things, any integrated circuit including, for example, a generic or non-specific integrated circuit, processor, controller, state machine, gate array, SoC, PGA and/or FPGA. The term "integrated circuit" also means any integrated circuit (e.g., processor, controller, state machine and SoC)—including an embedded FPGA.

Further, the term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

In the claims, the term "MAC circuit" means a multiplier-accumulator circuit having a multiplier circuit coupled to an accumulator circuit. For example, a multiplier-accumulator circuit is described and illustrated in the exemplary embodiment of FIGS. 1A-1C of U.S. patent application Ser. No. 16/545,345, and the text associated therewith. Notably, however, the term "MAC circuit" is not limited to the particular circuit, logical, block, functional and/or physical diagrams, block/data width, data path width, bandwidths, and processes illustrated and/or described in accordance with, for example, the exemplary embodiment of FIGS. 1A-1C of U.S. patent application Ser. No. 16/545,345, which, as indicated above, is incorporated by reference.

Notably, the limitations of the claims are not written in means-plus-function format or step-plus-function format. It is applicant's intention that none of the limitations be interpreted pursuant to 35 USC § 112, ¶6 or § 112(f), unless such claim limitations expressly use the phrase "means for" or "step for" followed by a statement of function and void of any specific structure.

What is claimed is:

1. A method of manufacturing an integrated-circuit device having a floating-point adder, the method comprising:

synthesizing, within a computing device, a netlist that defines bit-widths of conductive paths within the floating-point adder according to a plurality of bus width parameters declared within a hardware description language (HDL) specification of the floating-point adder, the plurality of bus width parameters corresponding to a first floating-point adder precision within a predetermined range of different floating-point adder precisions, wherein the plurality of bus width parameters define bit-widths of conductive paths within a plurality of different functional circuits of the floating-point adder, and wherein the plurality of bus width parameters are coordinated such that respective values of the plurality of bus width parameters collectively change in response to a change in floating-point adder precision within the predetermined range; and fabricating the integrated circuit device according to the netlist such that the conductive paths within the floating-point adder have bit-widths according to the netlist.

2. The method of claim 1 wherein the plurality of bus width parameters declared within the HDL specification include a first bus width parameter that matches a bit width of a mantissa value according to the first floating-point adder precision.

3. The method of claim 2 wherein synthesizing the netlist comprises defining a first conductive path that (i) conveys the mantissa value to an input of a combinatorial logic circuit within the floating-point adder and (ii) has a bit width according to the first bus width parameter, and wherein fabricating the integrated circuit device according to the netlist comprises fabricating the first conductive path having the bit width that matches the bit width of the mantissa value.

4. The method of claim 3 wherein the plurality of bus width parameters declared within the HDL specification include a second bus width parameter that exceeds the bit width of the mantissa value, and wherein synthesizing the netlist comprises defining a second conductive path coupled to an output of the combinatorial logic circuit and having a bit width according to the second bus width parameter.

5. The method of claim 4 wherein the combinatorial logic circuit comprises a right-shift circuit defined by the netlist to have a wider output bit depth than input bit depth in accordance with a numeric difference between the second and first bus width parameters.

6. The method of claim 5 wherein the wider bit depth at the right-shift circuit output relative to the right-shift circuit input enables the right-shift circuit to output a right-shifted mantissa value with additional bits relative to the mantissa value conveyed to the right-shift circuit input, the additional bits including one or more guard bits for numeric rounding.

7. The method of claim 1 wherein the predetermined range of different floating-point adder precisions includes maximum and minimum floating-point adder precisions at opposite ends of the range and for which the maximum floating-point adder precision is at least twice the minimum floating-point adder precision.

8. The method of claim 1 wherein the predetermined range of different floating-point adder precisions spans at least from a first precision corresponding to 16-bit binary floating point number to a second precision corresponding to a 32-bit binary floating point number.

9. The method of claim 1 wherein the HDL specification indicates, for one or more floating-point adder precisions at a lower end of the predetermined range of floating-point adder precisions, that one or more of the width parameters within the plurality of bus width parameters are to be bypassed in favor of other parameters.

10. The method of claim 1 wherein the plurality of bus width parameters declared within the HDL specification of the floating-point adder comprise one of a plurality of sets of the plurality of bus width parameters, each of the sets of the plurality of bus width parameters corresponding to a respective one of the different floating-point adder precisions within the predetermined range.

11. An integrated circuit device fabricated according to the method of claim 1.

12. A method of manufacturing an integrated-circuit device having a floating-point adder, the method comprising:

specifying, within a netlist, circuit interconnections corresponding to one of a plurality of different floating-point adder precisions according to a plurality of bus width parameters declared within a hardware description language (HDL) specification, including specifying either a first quantity or a second quantity of conductive interconnects between first and second components of the floating-point adder according to whether a first bus width parameter of the plurality of bus width parameters specifies a first value or a second value, respectively, wherein the plurality of bus width parameters define bit-widths of conductive paths within a plurality of different functional circuits of the floating-point adder, and wherein the plurality of bus width parameters are coordinated such that respective values of the plurality of bus width parameters collectively change in response to a change in floating-point adder precision within the predetermined range; and fabricating the integrated circuit device according to the netlist such that the first and second components of the floating-point adder are coupled to one another via either the first quantity or the second quantity of conductive interconnects in accordance with the first bus width parameter declared within the HDL specification.

13. The method of claim 12 wherein specifying circuit interconnections within the netlist further includes specifying either a third quantity or a fourth quantity of conductive interconnects between the second component and a third component of the floating-point adder according to whether a second bus width parameter of the plurality of bus width parameters specifies a third value or a fourth value, respectively.

14. The method of claim 13 wherein the third and fourth values differ by a first nonzero number and the first and second values also differ by that first nonzero number.

15. The method of claim 12 wherein:

the first component of the floating-point adder comprises a first register to store a first mantissa of a first floating-point operand; and the second component of the floating-point adder comprises a right-shift circuit to receive the first mantissa from the first register and generate a right-shifted version of the first mantissa.

16. The method of claim 15 wherein the third component of the floating-point adder comprises a combinatorial circuit to add the right shifted version of the first mantissa to a second mantissa of a second floating-point operand.

17. The method of claim 12 wherein the plurality of different floating-point adder precisions comprise a predetermined range of different floating-point adder precisions that spans at least from a first precision corresponding to 16-bit binary floating point number to a second precision corresponding to a 32-bit binary floating point number.

18. The method of claim 12 wherein the floating-point adder comprises a component of a multiply-accumulate processor within the integrated-circuit device.

19. The method of claim 12 wherein the plurality of bus width parameters declared within the HDL specification include a first bus width parameter that matches a bit width of a mantissa value according to a first floating-point adder precision within a predetermined range of different floating-point adder precisions.

20. An integrated circuit device fabricated according to the method of claim 12.

* * * * *